US011929396B2

(12) United States Patent
Hsu et al.

(10) Patent No.: US 11,929,396 B2
(45) Date of Patent: *Mar. 12, 2024

(54) CAVITY SPACER FOR NANOWIRE TRANSISTORS

(71) Applicant: INTEL CORPORATION, Santa Clara, CA (US)

(72) Inventors: William Hsu, Hillsboro, OR (US); Biswajeet Guha, Hillsboro, OR (US); Leonard Guler, Hillsboro, OR (US); Souvik Chakrabarty, Hillsboro, OR (US); Jun Sung Kang, Portland, OR (US); Bruce Beattie, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/725,471

(22) Filed: Apr. 20, 2022

(65) Prior Publication Data
US 2022/0246721 A1 Aug. 4, 2022

Related U.S. Application Data

(63) Continuation of application No. 16/023,511, filed on Jun. 29, 2018, now Pat. No. 11,342,411.

(51) Int. Cl.
H01L 29/06 (2006.01)
B82Y 10/00 (2011.01)
(Continued)

(52) U.S. Cl.
CPC .. *H01L 29/0673* (2013.01); *H01L 21/823821* (2013.01); *H01L 29/0653* (2013.01);
(Continued)

(58) Field of Classification Search
CPC ............. H01L 29/785; H01L 29/42392; H01L 29/0673; H01L 29/66795;
(Continued)

(56) References Cited

U.S. PATENT DOCUMENTS 9,508,796 B2 11/2016 Kim et al.
9,653,289 B1 5/2017 Balakrishnan et al.
(Continued)

FOREIGN PATENT DOCUMENTS

| TW | 201735256 A | 10/2017 |
|---|---|---|
| WO | WO-2015142357 | 9/2015 |
| WO | WO-2017111974 | 6/2017 |

OTHER PUBLICATIONS

Office Action from European Patent Application No. 19176641.9, dated Sep. 28, 2021, 6 pgs.
(Continued)

*Primary Examiner* — Changhyun Yi
(74) *Attorney, Agent, or Firm* — Schwabe, Williamson & Wyatt, P.C.

(57) ABSTRACT

A transistor structure includes a base and a body over the base. The body comprises a semiconductor material and has a first end portion and a second end portion. A gate structure is wrapped around the body between the first end portion and the second end portion, where the gate structure includes a gate electrode and a dielectric between the gate electrode and the body. A source is in contact with the first end portion and a drain is in contact with the second end portion. A first spacer material is on opposite sides of the gate electrode and above the first end portion. A second spacer material is adjacent the gate structure and under the first end portion of the nanowire body. The second spacer material is below and in contact with a bottom surface of the source and the drain.

20 Claims, 12 Drawing Sheets

Section C-C

(51) Int. Cl.

| | | |
|---|---|---|
| *H01L 21/8238* | (2006.01) | |
| *H01L 29/423* | (2006.01) | |
| *H01L 29/66* | (2006.01) | |
| *H01L 29/78* | (2006.01) | |

(52) U.S. Cl.
CPC .. *H01L 29/42364* (2013.01); *H01L 29/42392* (2013.01); *H01L 29/66545* (2013.01); *H01L 29/785* (2013.01); *B82Y 10/00* (2013.01)

(58) Field of Classification Search
CPC ......... H01L 2029/7858; H01L 29/0653; H01L 29/6656; H01L 21/823821; H01L 29/42364; H01L 29/66545; H01L 29/66742; H01L 29/66772; H01L 29/78696; H01L 21/823412
See application file for complete search history.

(56) References Cited

U.S. PATENT DOCUMENTS

| | | | | |
|---|---|---|---|---|
| 10,170,638 | B1* | 1/2019 | Reznicek | H01L 29/0649 |
| 11,342,411 | B2* | 5/2022 | Hsu | H01L 29/66469 |
| 2016/0211322 | A1* | 7/2016 | Kim | H01L 29/78696 |
| 2017/0194143 | A1* | 7/2017 | Balakrishnan | H01L 29/495 |
| 2017/0194430 | A1 | 7/2017 | Wood et al. | |
| 2017/0222006 | A1 | 8/2017 | Suh et al. | |
| 2017/0352684 | A1* | 12/2017 | Yang | H01L 29/78684 |
| 2018/0082902 | A1 | 3/2018 | Balakrishnan | |
| 2018/0108526 | A1* | 4/2018 | Mitard | H01L 21/02664 |
| 2018/0108787 | A1 | 4/2018 | Cheng | |
| 2019/0181224 | A1 | 6/2019 | Zhang | |
| 2019/0341450 | A1 | 11/2019 | Lee | |

OTHER PUBLICATIONS

Jang Doyoung et al., "Device Exploration of NanoSheet Transistors for Sub-7-nm Technology Node", IEEE Transactions on Electron Devices, Jun. 1, 2017, pp. 2707-2713, vol. 64, No. 6.
European Extended Search Report for European Application No. 19176641.9 dated Dec. 2, 2019, 10 pages.
Jing Wang et al., "Performance Evaluation of Ballistic Silicon Nanowire Transistors with Atomic-Basis Dispersion Relations", Purdue University, 12 pages.
Mark Lapedus, "Semiconductor Engineering: What Transistors Will Look Like at 5nm", Technical Paper Link, Aug. 18, 2016, 8 pages.
Setting Up the Christmas Tree for 40 Electronics, Semiconductor Today, Dec. 21, 2012, 4 pages.
Office Action from Taiwan Patent Application No. 108117115), dated Nov. 21, 2022, 21 pgs.
Office Action from Taiwan Patent Application No. 108117115, dated Jan. 18, 2023, 21 pgs.
Notice of Allowance from Taiwan Patent Application No. 108117115, dated Dec. 13, 2023, 3 pgs.

* cited by examiner

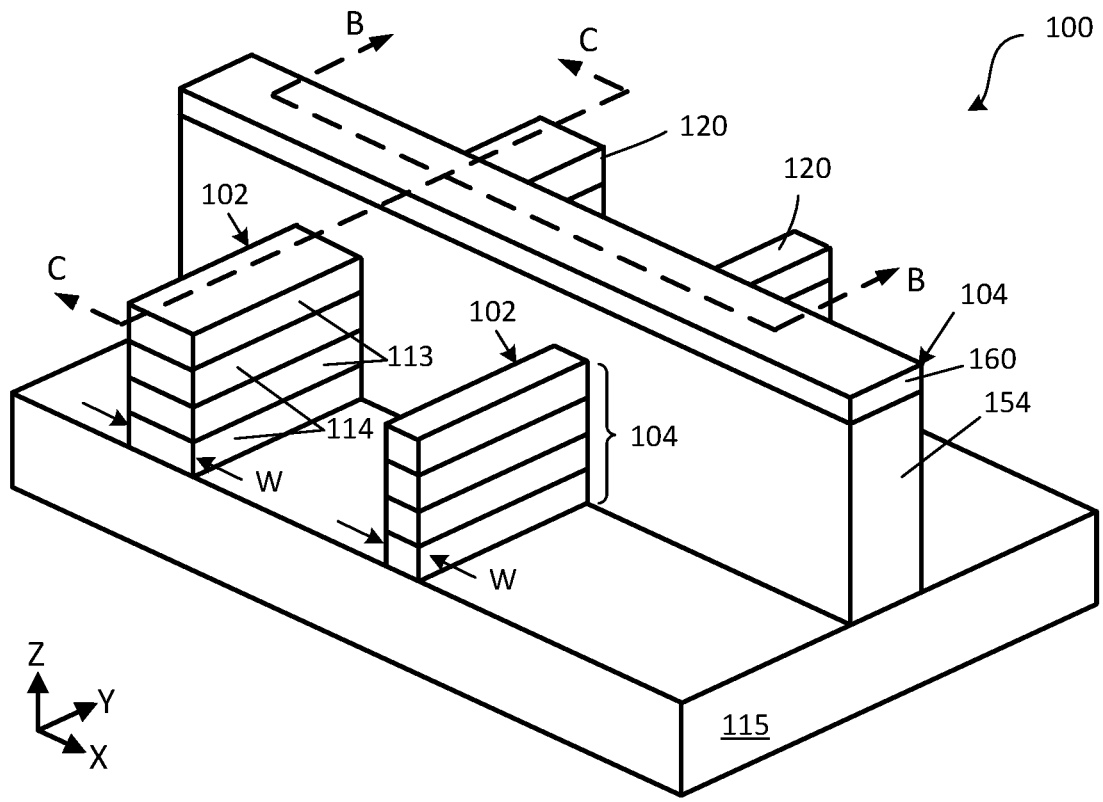
FIG. 5A
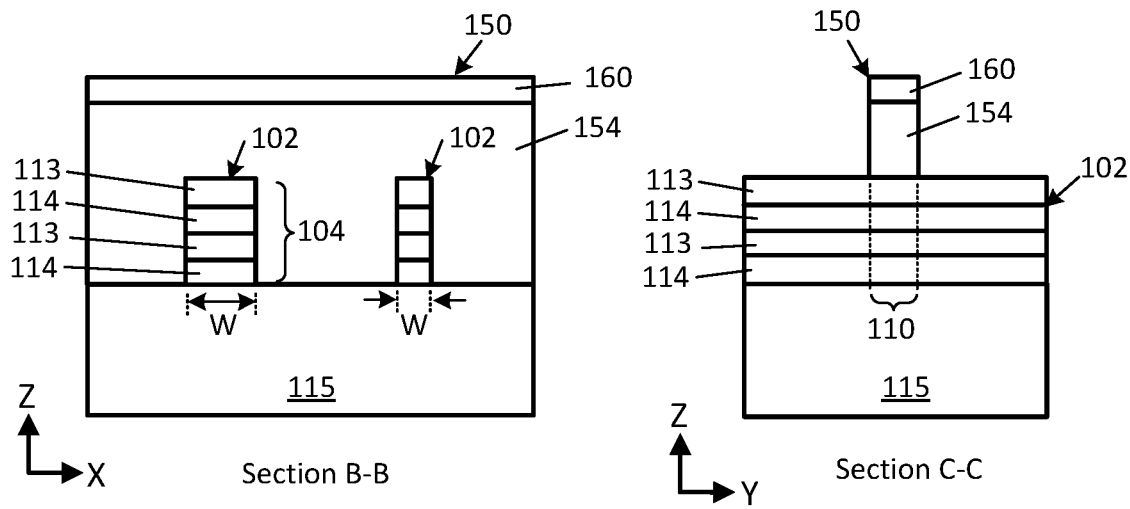
FIG. 5B  FIG. 5C

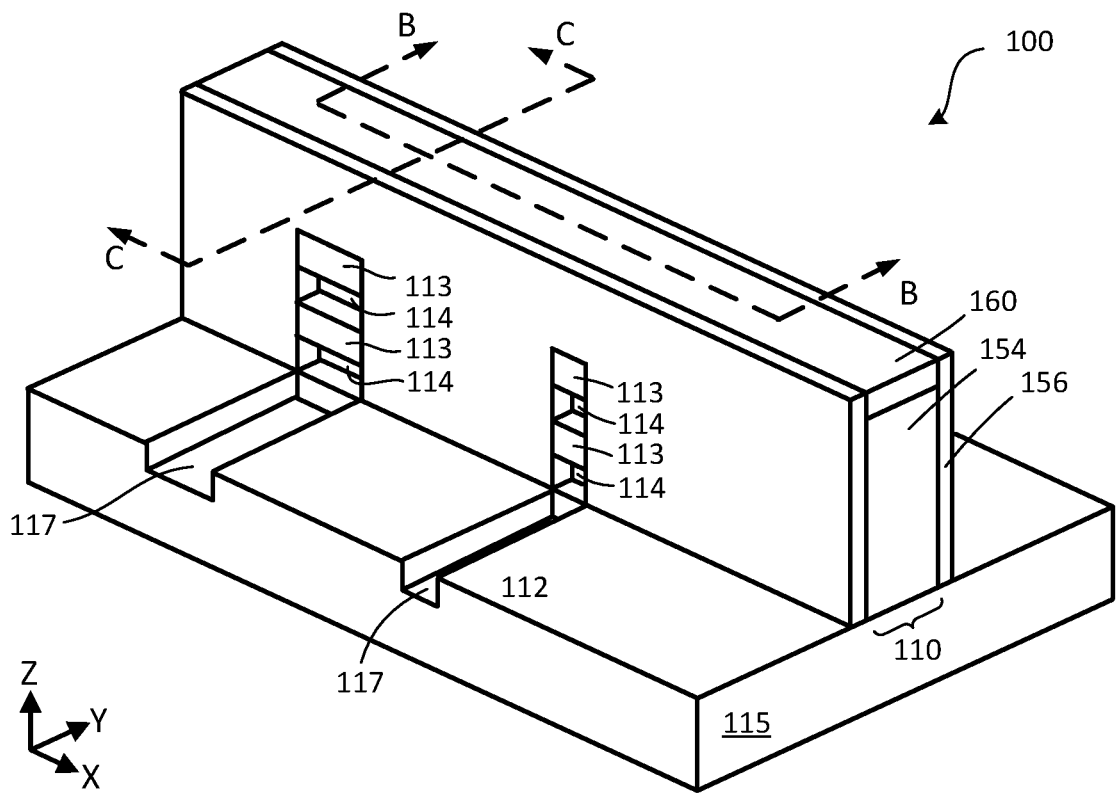
FIG. 8A
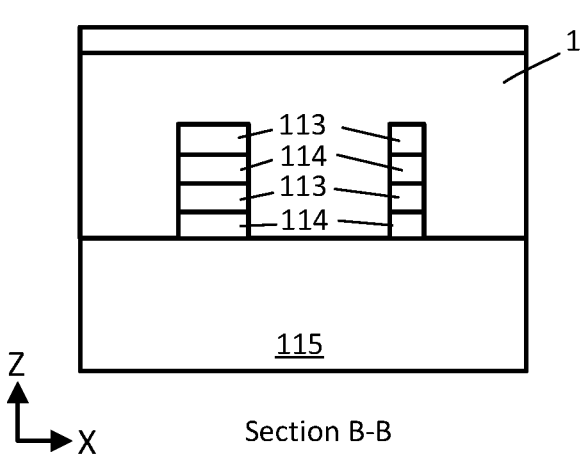
FIG. 8B
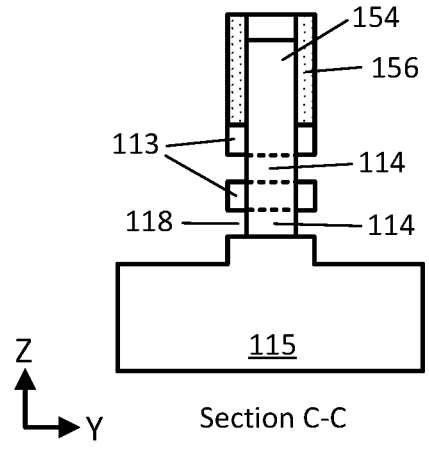
FIG. 8C
FIG. 8A

Section C-C

Section C-C

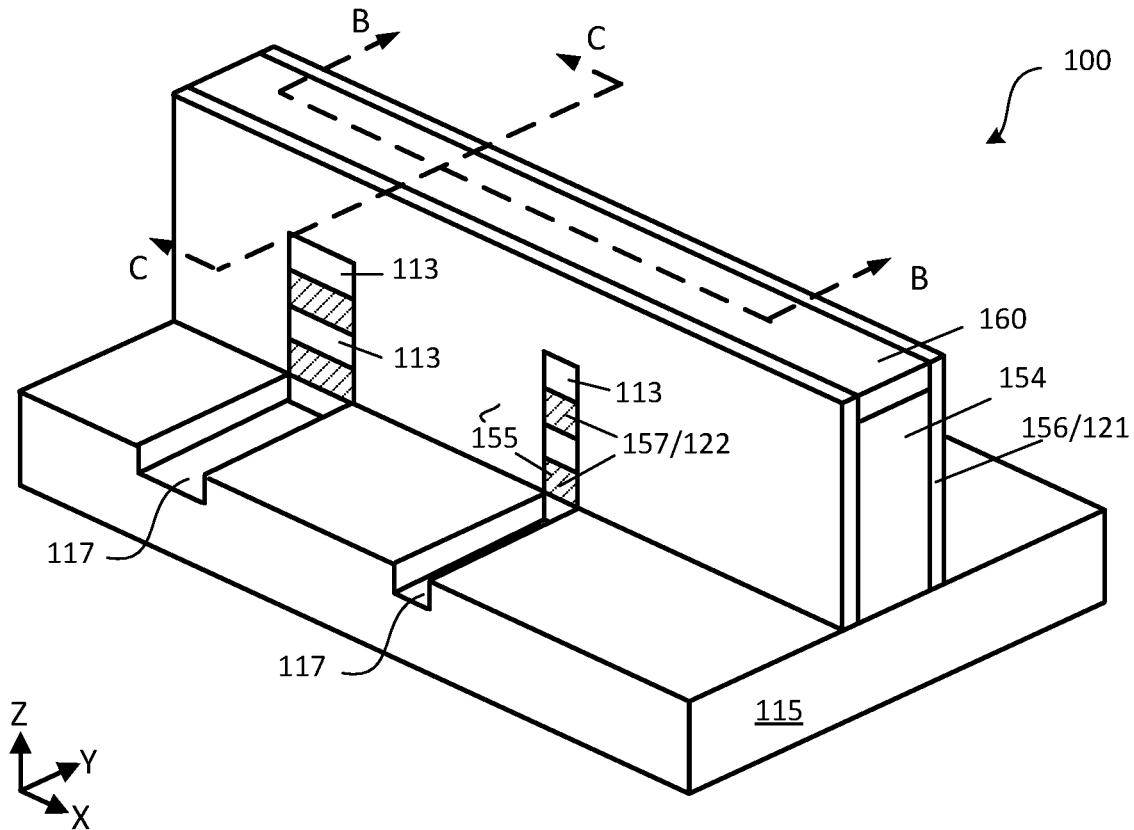
FIG. 11A
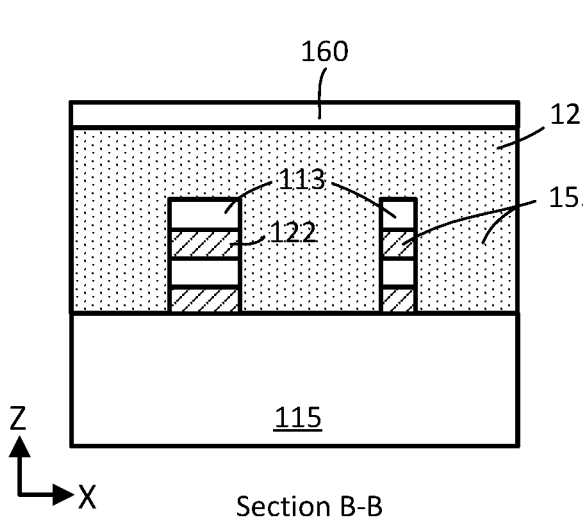 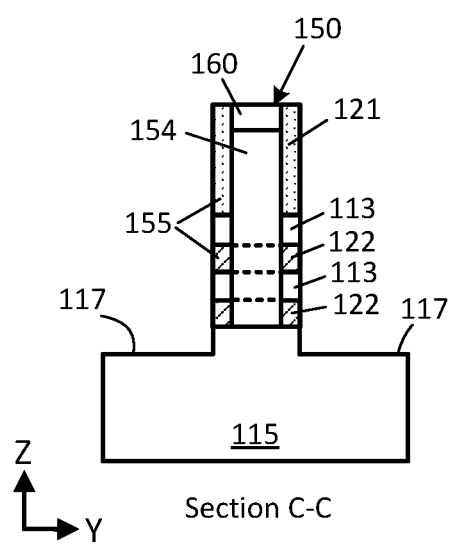
FIG. 11B     FIG. 11C

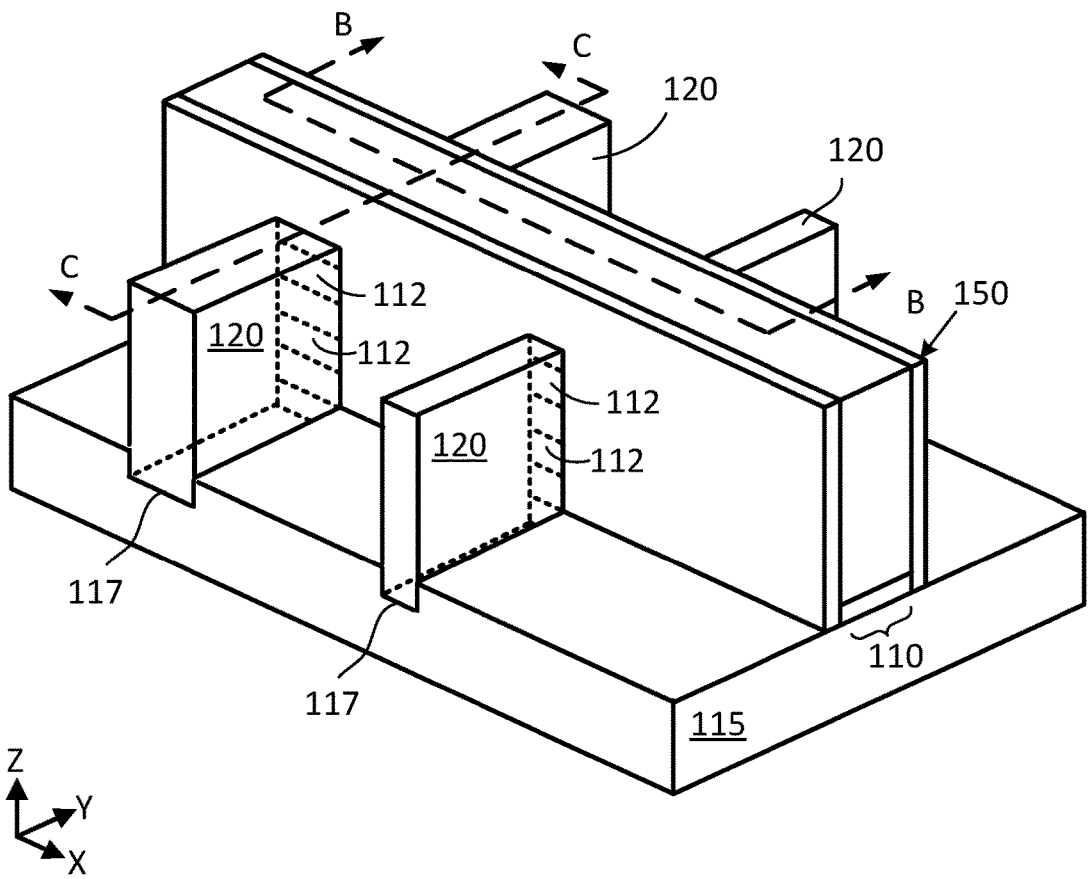
FIG. 13A
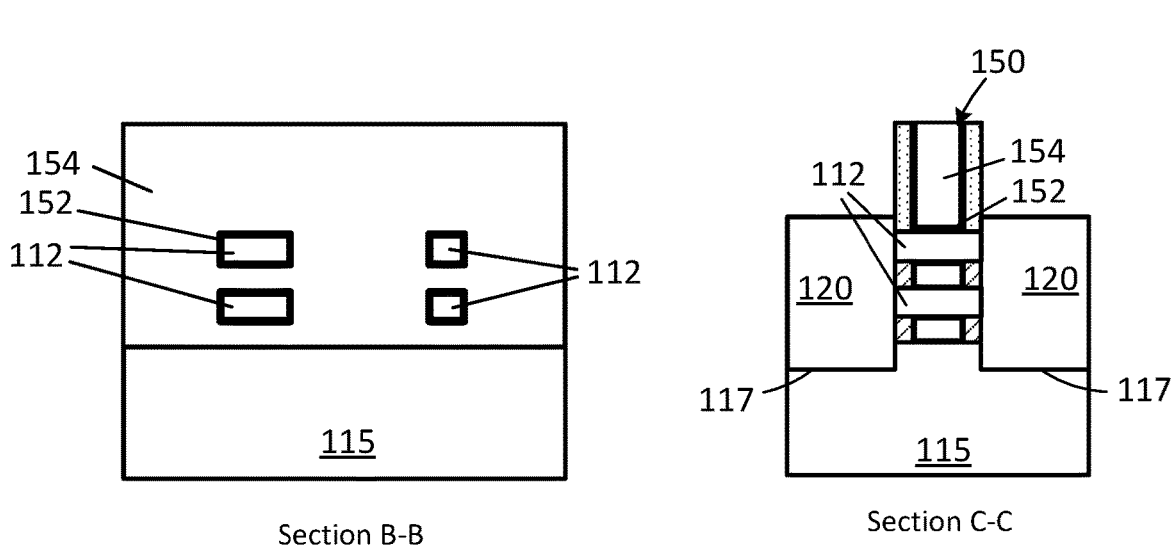
Section B-B
Section C-C
FIG. 13B
FIG. 13C

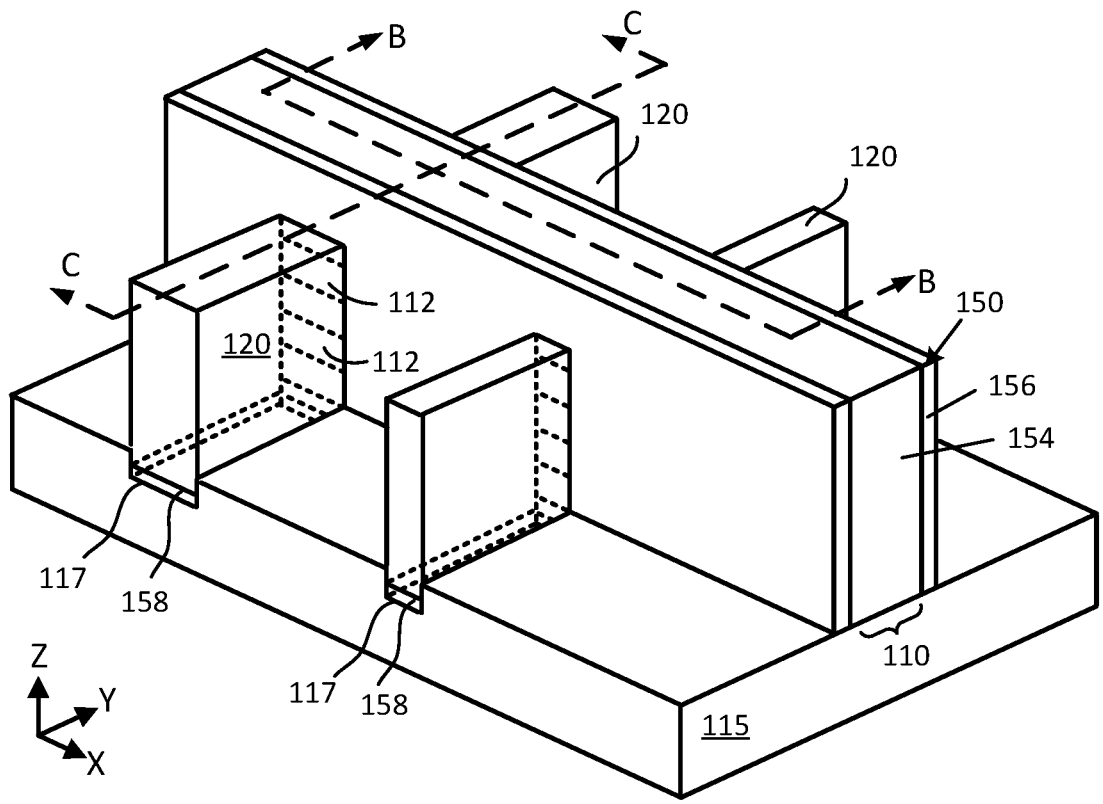
FIG. 14A
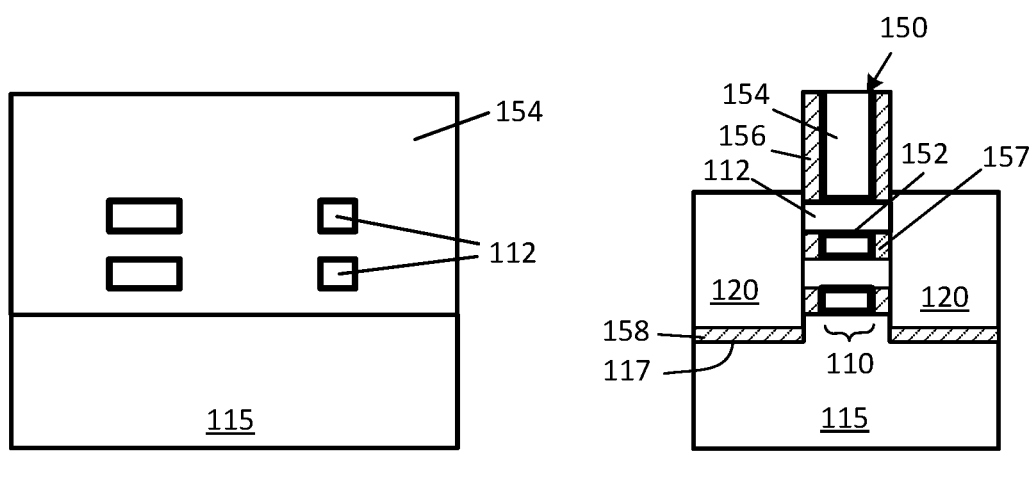
Section B-B
FIG. 14B
Section C-C
FIG. 14C

US 11,929,396 B2

CAVITY SPACER FOR NANOWIRE TRANSISTORS

CROSS-REFERENCE TO RELATED APPLICATIONS

This application is a continuation of U.S. patent application Ser. No. 16/023,511, filed Jun. 29, 2018, the entire contents of which is hereby incorporated by reference herein.

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel between the source and drain. In instances where the charge carriers are electrons, the FET is referred to as an n-channel device, and in instances where the charge carriers are holes, the FET is referred to as a p-channel device. Some FETs have a fourth terminal, such as the substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A nanowire transistor (sometimes referred to as a gate-all-around (GAA) or nanoribbon transistor) is similar to a fin-based transistor, but the channel region comprises nanowires or nanoribbons instead of a finned channel region, for example. In some such GAA transistors, the gate material generally surrounds or encircles each nanowire or nanoribbon (hence, gate-all-around).

BRIEF DESCRIPTION OF THE DRAWINGS

FIG. 5A illustrates a perspective view of an example semiconductor structure with fins of different fin widths and a dummy gate structure over the fins, in accordance with an embodiment of the present disclosure.

FIG. 5B illustrates a cross-sectional view of the semiconductor structure of FIG. 5A as taken along line B-B, in accordance with an embodiment of the present disclosure.

FIG. 5C illustrates a cross-sectional view of the semiconductor structure of FIG. 5A as taken along line C-C, in accordance with an embodiment of the present disclosure.

FIG. 8A illustrates a perspective view of an example semiconductor structure with sacrificial material recessed to define cavities between layers of semiconductor material in a channel region, and showing notches in the base, in accordance with an embodiment of the present disclosure.

FIG. 8B illustrates a cross-sectional view of the semiconductor structure of FIG. 8A taken along line B-B, in accordance with an embodiment of the present disclosure.

FIG. 8C illustrates a cross-sectional view of the semiconductor structure of FIG. 8A taken along line C-C, in accordance with an embodiment of the present disclosure.

FIG. 11A illustrates a perspective view of the semiconductor structure of FIG. 9 after etching back the second layer of spacer material, in accordance with an embodiment of the present disclosure.

FIG. 11B illustrates a cross-sectional view of the semiconductor structure of FIG. 11A taken along line B-B, in accordance with an embodiment of the present disclosure.

FIG. 11C illustrates a cross-sectional view of the semiconductor structure of FIG. 11A taken along line C-C, in accordance with an embodiment of the present disclosure.

FIG. 13A illustrates a perspective view of the semiconductor structure of FIG. 11A after forming replacement source and drain materials, in accordance with an embodiment of the present disclosure.

FIG. 13B illustrates a cross-sectional view of the semiconductor structure of FIG. 13A taken along line B-B, in accordance with an embodiment of the present disclosure.

FIG. 13C illustrates a cross-sectional view of the semiconductor structure of FIG. 13A taken along line C-C, in accordance with an embodiment of the present disclosure.

FIG. 14A illustrates a perspective view of the semiconductor structure of FIG. 12A after etching back the second layer of spacer material, in accordance with an embodiment of the present disclosure.

FIG. 14B illustrates a cross-sectional view of the semiconductor structure of FIG. 14A taken along line B-B, in accordance with an embodiment of the present disclosure.

FIG. 14C illustrates a cross-sectional view of the semiconductor structure of FIG. 14A taken along line C-C, in accordance with an embodiment of the present disclosure.

Figure 1:
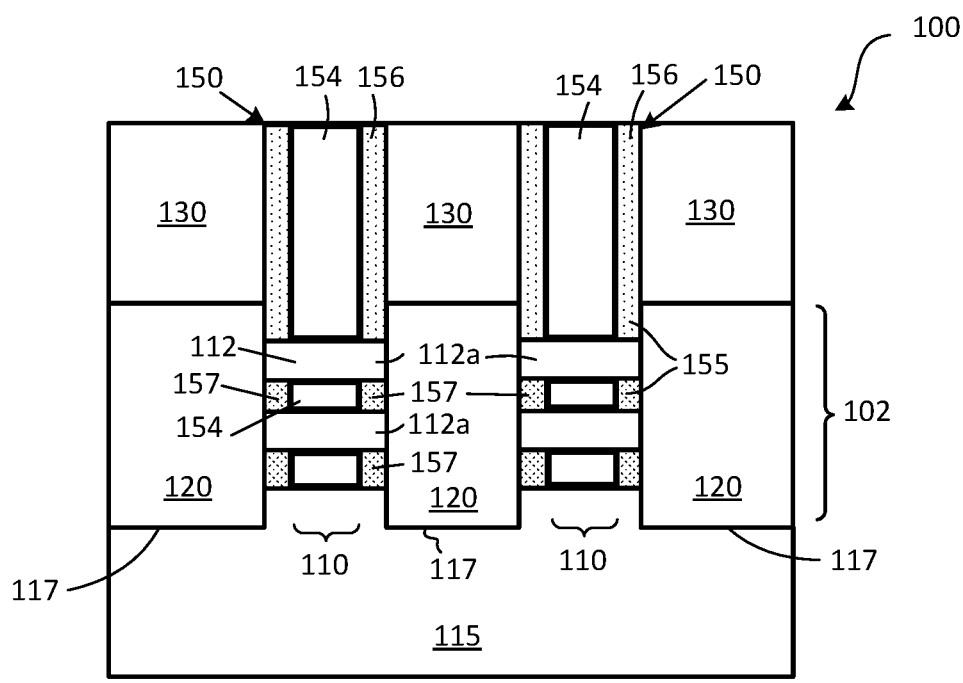
FIG. 1 illustrates a cross-sectional view of a nanowire transistor structure showing a gate spacer, a cavity spacer, and notches in the base material under the source and drain, in accordance with some embodiments of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for forming channel spacers in an integrated circuit having nanoribbon and/or nanowire transistor structures. Such techniques are particularly useful where various transistor structures have nanowires/nanoribbons of different widths (i.e., channel widths or fin widths). In accordance with some embodiments, methodologies of the present disclosure enable uniform alignment of the cavity spacer with the gate structure. Such a feature is an advantage for nanowire transistors of different nanowire widths (Wsi) on the same chip or the same device. For example, techniques of the present disclosure may benefit an integrated circuit (IC) with various nanowire transistor structures, some of which are located in a first region of the IC and have a first channel width (e.g., nanowire transistors), and others located in a second region of the IC that have a second channel width that is different from the first channel width (e.g., nanoribbon transistors).

In a method of processing a nanowire transistor structure according to one embodiment, a first spacer material is deposited over a semiconductor fin with a dummy gate, where the semiconductor fin includes an alternating layer stack of semiconductor material and sacrificial material. The source and drain regions of the fin are then removed, leaving a layer stack in the channel region under the dummy gate. When removing the source and drain regions, an etch recess or notch in the base may result. The sacrificial material is recessed part way into the channel region to define cavities between end portions of the semiconductor material, followed by deposition of a second spacer material that fills the cavities in the layer stack. The second spacer material is etched back to expose the ends of the semiconductor material in the channel region (i.e., nanowires). Replacement source and drain materials can then be deposited. When the etch recesses are present from removing the source and drain, the replacement source and drain material has a bottom surface in the etch recess. In some embodiments, the second spacer material in the cavity between nanowires is compositionally different form the first spacer material along the gate electrode. This second spacer material may also be present in the etch recesses under the source/drain if not completely removed before forming the replacement source/drain.

In some embodiments, the method of processing includes removing the first spacer material before depositing the second spacer material. For example, after removing the first spacer material, a relatively thick layer of second spacer material (which may be the same material) is conformally deposited. In doing so, the second spacer material forms a cavity spacer (i.e., in the cavity between nanowires) and forms the channel spacer along opposite faces of the gate electrode. In some such embodiments, the spacer deposition is performed using atomic layer deposition (ALD) or chemical vapor deposition (CVD). The second spacer material is then etched anisotropically to expose the ends of the nanowires in the channel region. Replacement source and drain materials can then be deposited. In some such embodiments, a residual layer of spacer material remains on the substrate below the source and drain as an indicator of the etch processing used to remove the source and drain regions.

General Overview

Field effect transistors (FETs) have been scaled to smaller and smaller sizes to achieve faster circuit operation. Such scaling has resulted in the development of the nanowire and nanoribbon transistors or gate-all-around (GAA) transistors. For example, the GAA channel region can have one or more nanowires extending between source and drain regions, such as a vertical stack of nanowires that extend between the source and drain regions. In one example methodology, alternating layers of silicon (Si) and silicon germanium (SiGe) are formed on a bulk silicon substrate. The resulting structure is then etched to define a fin that includes a silicon subfin and alternating layers of SiGe and Si on top of the subfin. The SiGe can be removed during gate processing, such as by a gas-phase chlorine trifluoride ($ClF_3$) etch, to release silicon nanowires extending between and connecting the source and drain regions of the fin. A similar process can be used to release nanowires of silicon germanium (SiGe), germanium (Ge), gallium arsenide (GaAs), or other semiconductor materials.

One challenge of nanowire processing occurs when forming the cavity spacer between adjacent nanowires. For example, an integrated circuit includes both nanowire transistors and nanoribbon transistor structures adjacent each other on a die. When devices of different channel widths are present in the same device or in the same circuit, the etch process to recess the sacrificial material is generally configured for a particular channel width. When the spacer etch is tailored for the nanowires of a smaller channel width, the sacrificial material can be under etched in devices having a larger channel width. Similarly, when the etch parameters are tailored for the nanoribbons of a greater channel width, the sacrificial material is over etched between the nanowires of a smaller channel width. Whether under etched or over etched, the spacer material deposited to fill the cavities between nanowires does not align with the edge of the gate electrode. For this reason, performance can be reduced for one or both devices associated with current leakage or parasitic capacitance due to poor alignment of the cavity spacer with respect to the gate electrode.

Thus, and in accordance with various embodiments of the present disclosure, techniques are provided for forming uniformly aligned spacer materials in nanowire devices of different channel widths. The gate spacer can be formed in a two-part process that includes formation of the gate spacer portion and formation of the cavity spacer portion. In one such embodiment, a first spacer material is deposited on opposite sides of a dummy gate. The source/drain regions are then removed. The sacrificial material between the nanowires is etched back to the edge of the polysilicon dummy gate. A second spacer material is then deposited over the resulting structure with the second spacer filling the cavity between nanowires outside of the channel under the gate. The second spacer material is etched back to expose ends of the nanowires for epitaxial deposition of the replacement source/drain material. As a result of multiple etch processes, the resulting structure may include an etch recess or notch in the base material. For example, the etch recess is adjacent the end portions of the nanowires and extends down into the base material (e.g., silicon) on both sides of the gate. In addition, such an embodiment may exhibit two spacer materials that are compositionally different. For example, a first spacer material (e.g., silicon nitride) is a gate spacer located along opposite sides of the gate electrode and above the top nanowire. A second spacer material (e.g., titanium nitride) is a cavity spacer that occupies the cavities between nanowire end portions located just outside of the channel region below the gate electrode.

In one embodiment, the first spacer material is a sacrificial spacer material deposited over a dummy gate. After etching back the sacrificial layer between nanowires, the sacrificial spacer material is removed, followed by deposition of a second spacer material. The second deposition forms the gate spacer and cavity spacer at the same time and is a relatively thicker layer of spacer material. An anisotropic etch can then be performed to expose the nanowires in preparation for forming the source/drain regions. In some such embodiments, the anisotropic etch does not remove all of the spacer material from the substrate. As a result, residual spacer material is present below the source/drain material. In other words, a layer of spacer material exists between the bottom of the source/drain and the substrate.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, TEM can be useful to show a cross section of the device structure. In one example, such tools may indicate a finFET transistor structure with spacer material located between the bottom surface of the source and/or drain materials and the base material. In another example, TEM can be used to indicate a nanowire transistor structure having two compositionally different channel spacer materials, such as a first material used as a cavity spacer portion below a top nanowire or nanoribbon and a second material used as a gate spacer along the gate electrode above the top nanowire or nanoribbon. In some embodiments, the techniques described herein may be detected based on the benefits derived from their use, which includes channel materials with reduced parasitic capacitance due to a reduced overlap between metal layers and semiconductor materials, reduced transistor structure variation, reduced leakage, and/or other improved device performance. Numerous configurations and variations will be apparent in light of this disclosure.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes. Specifically, in accordance with some embodiments, a nanowire is a structure that has a thickness or diameter on the order of tens of nanometers or less, and an unconstrained length. A nanowire can be made of semiconducting material, a semiconducting metal oxide, a metal, or a carbon nanotube. Also, while some embodiments are discussed with reference to structures with nanowires, the present disclosure also applies to structures with nanoribbons and nanosheets, and to integrated circuits containing structures with both nanowires and nanoribbons/nanosheets.

Further note that the term "end" as used herein with respect to nanowires or nanoribbons need not be the absolute or terminal end of a given length. Rather, the end may simply refer to a portion of that nanowire/nanoribbon that includes a source or drain region. For instance, in cases where the source/drain region is continuous with the channel region, such as when the source/drain regions are doped portions of the multilayer structure from which the nanowires are formed, the "end" may refer to the portion of the nanowire/nanoribbon that includes the source/drain region as well as the region under the gate spacer (if a gate spacer if present). In other cases, such as in cases where the source/drain regions are replacement or epitaxial source/drain regions, the end may be the portion of the nanowire/nanoribbon within the gate spacer and/or between the source/drain region and the channel region.

As discussed herein, terms referencing direction, such as upward, downward, vertical, horizontal, left, right, front, back, etc., are used for convenience to describe embodiments of integrated circuits having a base or substrate extending in a horizontal plane. Embodiments of the present disclosure are not limited by these directional references and it is contemplated that integrated circuits and device structures in accordance with the present disclosure can be used in any orientation.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Architecture and Methodology

FIG. 1 illustrates a cross-sectional view of an example semiconductor structure 100 in accordance with an embodiment of the present disclosure. The example of FIG. 1 is a nanowire transistor structure that includes a fin 102 of semiconductor material with two gate structures 150 on the fin 102 in a gate-all-around configuration. The section is taken through the fin 102, parallel to nanowire channel regions 110 and perpendicular to each gate structure 150. The semiconductor structure 100 includes a channel region 110 under each gate structure 150, where each channel region 110 includes one or more nanowires 112 extending between source/drain regions 120 located on opposite sides of the channel region 110. The source/drain regions 120 are on a base or substrate 115 of semiconductor material. The substrate 115 defines a notch 117 under the source/drain region 120. For example, the base 115 material is recessed in the notch 117 compared to the base 115 material under the gate structure (i.e., in the channel). Since the source/drain 120 material is formed in the notch 117, the source/drain 120 is partially recessed into the base. The notches 117 result, for example, from spacer etch processing, as will be discussed in more detail below. In some embodiments, the notch 117 extends from 5 to 50 nm into the base 115. In some embodiments, the notch 117 includes a residual layer of spacer material that is the same as the material used for the cavity spacer 157.

A gate structure 150 wraps around the nanowires 112 in a gate-all-around (GAA) configuration. In the example shown in FIG. 1, two gate structures 150 are shown, each one having a gate dielectric 152 wrapped around the body of the nanowires 112, and a gate electrode 154 on the gate dielectric 152. In one example, the gate electrode 154 comprises polysilicon, a metal, or other suitable material. A layer of interlayer dielectric 130 (ILD) is on top of the source/drain 120 and fills open areas between adjacent structures, as will be appreciated.

A gate spacer 155 includes a gate spacer portion 156 along opposite sides of the gate electrode 154. For example, the gate spacer portion 156 is above the top nanowire 112 in the structure. The gate spacer 155 also includes a cavity spacer portion 157 under end portions 112a of the nanowires 112. For example, the end portions 112a of the nanowire 112 are located just outside of the channel region 110, which is under the gate electrode 154. The cavity spacer portion 157 adjacent the gate electrode 154 is colinear with the gate spacer portion adjacent the gate electrode 154. In an integrated circuit having nanowires 112 and nanoribbons of different widths, the cavity spacer portion 157 can be formed to extend laterally along the nanowire/nanoribbon 112 so that the cavity spacer portion 157 is adjacent the edge of the gate electrode 154 and colinear with the boundary between the gate spacer portion 156 and gate electrode 154. Processing such an integrated circuit is discussed in more detail below with reference to method 200.

The gate spacer 155 can be formed of one or more materials, such as silicon nitride ($Si_3N_4$), silicon oxynitride (SiON), or silicon oxycarbide (SiOC), or a low-k dielectric. Here, "low-k" dielectric" means a material with a dielectric constant below that of silicon dioxide ($SiO_2$), which is about 3.9. In one embodiment, the gate spacer portion 156 is compositionally different from the cavity spacer portion 157. In some such embodiments, the different materials in the gate spacer portion 156 and the cavity spacer portion 157 can be identified via SIMS, TEM EDX mapping, or Atom Probe Tomography. The presence of compositionally different materials in the gate spacer 155 is evidence of depositing the spacer material in two steps, once for each of the two layers of spacer material deposited, in accordance with some embodiments. In other embodiments, the material in the gate spacer portion 156 and the cavity spacer portion 157 are the same material, even though the two portions of the gate spacer 155 may be deposited in separate processes.

Figure 2:
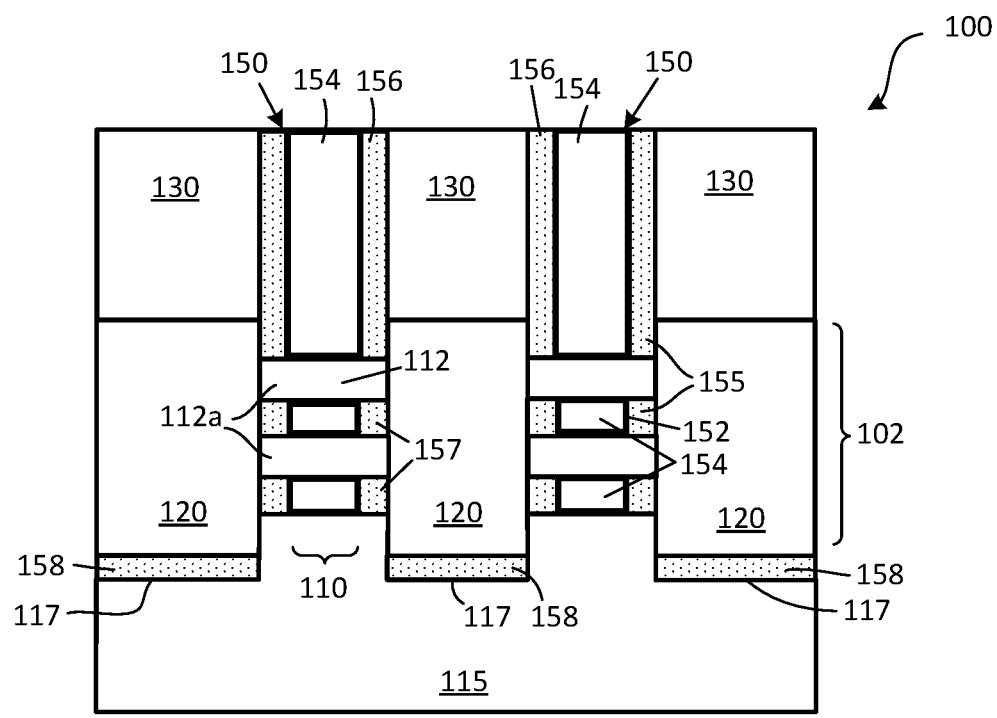
FIG. 2 illustrates a cross-sectional view of a nanowire transistor structure with a gate spacer, a cavity spacer, and spacer material in notches under the source and drains, in accordance with some embodiments of the present disclosure.

FIG. 2 illustrates a cross-sectional view of another semiconductor structure 100 in accordance with an embodiment the present disclosure. Similar to the embodiment of FIG. 1, the cross section is taken through the fin 102, parallel to nanowire channel regions 110 and perpendicular to each gate structure 150. In this embodiment, the gate structures 150 have a gate-all-around configuration with a gate dielectric 152 wrapped around the body of each nanowire 112 and a gate electrode 154 on the gate dielectric 152.

In this example, the gate spacer 155 includes a gate spacer portion 156 along opposite sides of the gate electrode 154, and a cavity spacer portion 157 below end portions 112a of nanowires 112. For example, the cavity spacer portion 157 is located laterally outside of the gate electrode 157, and vertically below end portions 112a of each nanowire 112. The inner edge of the cavity spacer portion 157 is aligned with the inner edge of the gate spacer portion 156. That is, the cavity spacer portion 157 and the gate spacer portion 156 are aligned vertically along the gate electrode 154. The inner edge of the cavity spacer portion 157 extends laterally to the edge of the gate structure. In some such embodiments, the cavity spacer portion 157 provides for a consistent width of the gate electrode 154 above and below each nanowire 112. For example, the cavity spacer portion extend laterally along the nanowire 112 to within a predefined distance of the vertical boundary between the gate spacer portion 156 and the gate electrode 154 above the top nanowire 112. In some embodiments, this predefined distance is no more than 2 nm, no more than 1 nm, or no more than 0.5 nm. Thus, the channel spacer portion 156 and gate spacer portion 157 are more consistently aligned, particularly when a single die or chip has transistor structures of different channel widths.

In this example embodiment, the gate spacer portion 156 and the cavity spacer portion 157 are the same material. The material of the gate spacer 155 is also present as a residual layer 158 under the source/drain 120 in each trench 117. The residual layer 158 of spacer material can result, for example, from processing the gate spacer 155 as discussed in more detail below. In one example, the spacer material is deposited conformally over the semiconductor structure 100 and then etched back to define cavity spacer portions 157 and to expose ends of the nanowires 112 prior to epitaxial formation of the source/drain regions 120. In etching back the spacer material to the desired position, all of the spacer material may not be removed from the notches 117. Accordingly, the residual layer 158 of spacer material is present in the bottom of the notches 117 when the replacement material of the source/drain 120 is deposited. Details of processing various embodiments of a semiconductor structure 100 are discussed in more detail below.

Figure 3:
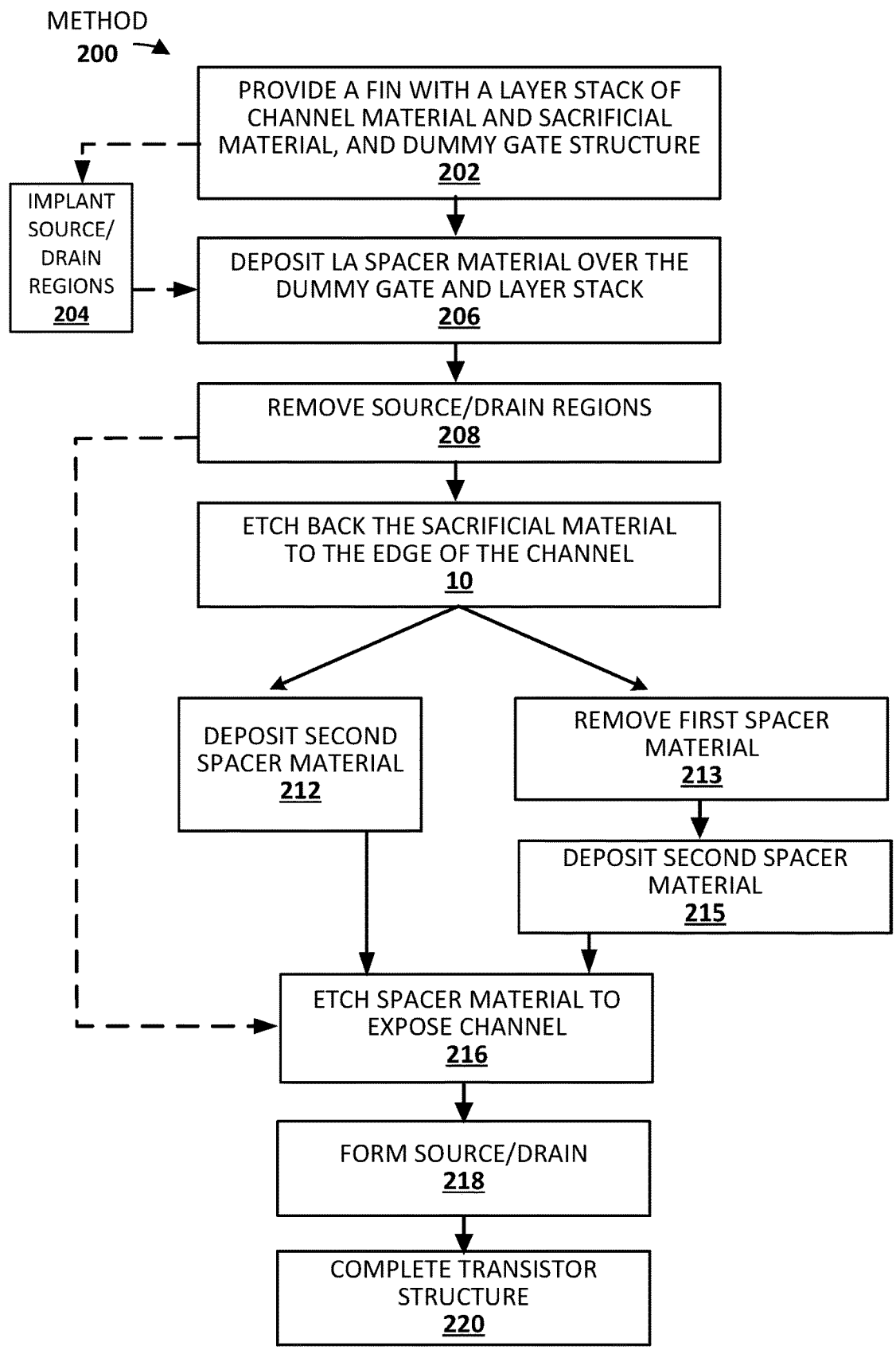
FIG. 3 is a flow chart showing example processes in a method of fabricating a nanowire transistor or integrated circuit, in accordance with some embodiments of the present disclosure.
Figure 4:
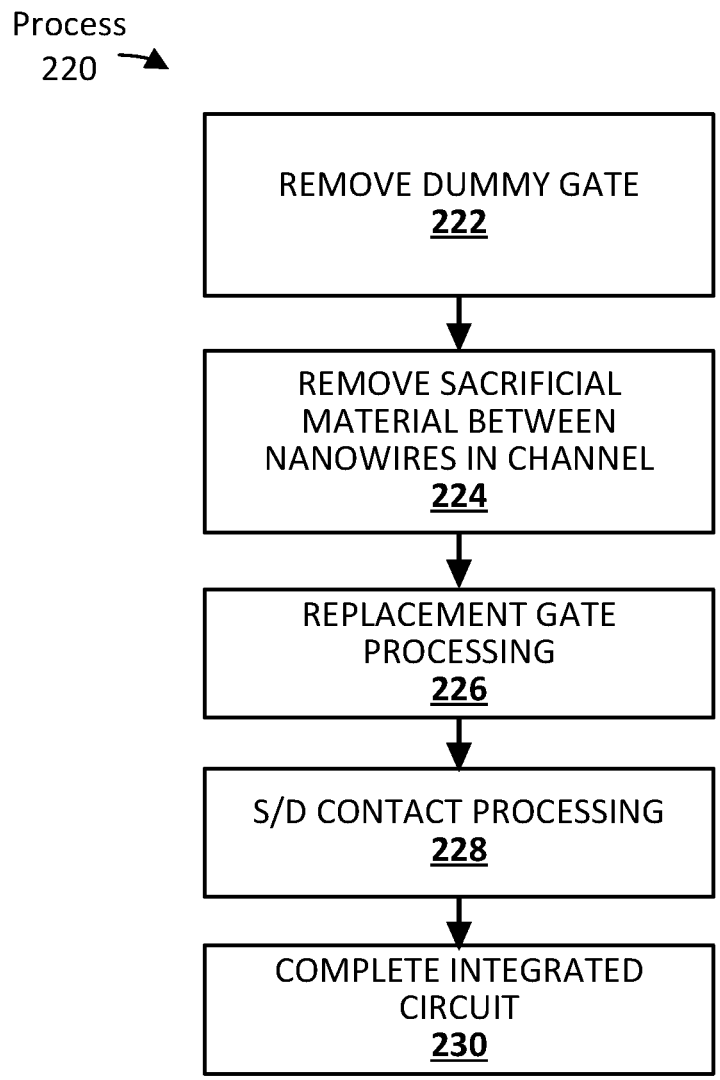
FIG. 4 is a flow chart showing processes in completing a transistor structure as noted in FIG. 3, in accordance with an embodiment of the present disclosure.

Turning now to FIGS. 3-4, flowcharts illustrate processes in a method 200 of processing a nanowire structure, in accordance with some embodiments. FIG. 3 shows example processes of method 200 and FIG. 4 shows examples of processes involved in completing 220 a nanowire transistor structure. Method 200 will be discussed with reference to example structures shown in FIGS. 5-14.

Method 200 of FIG. 3 begins with providing 202 a semiconductor fin with a layer stack of channel material and sacrificial material, and having a dummy gate structure on the fin. FIGS. 5A-5C illustrate views of an example of such a structure. FIG. 5A shows a perspective view, FIG. 5B shows a sectional view taken through the gate structure along line B-B of FIG. 5A, and FIG. 5C shows a sectional view taken through a fin along line C-C of FIG. 5A. In this example, the semiconductor structure 100 includes two fins 102 of different channel widths (W) or lateral thickness in the X-direction. Each fin 102 has a layer stack 104 that defines the fin 102 extending vertically up from a substrate or base 115. The layer stack 104 includes alternating layers of channel material 111 and sacrificial material 114, starting with sacrificial material 114 on the base 115. Although the top layer is illustrated in FIGS. 5A-5C as channel material 111, some embodiments may include an additional layer of sacrificial material 114, an oxide (e.g., $SiO_2$), a nitride (e.g., $Si_3N_4$), or other layer of material that protects the top layer of channel material 113 during various processes. In this example, however, the exposed portions of the fins 102 outside of the gate structure are intended to be removed and replaced with replacement source/drain material, as will be discussed in more detail below. As such, the absence of a top protective layer may be advantageous to facilitate removal of these portions of the fins 102. Numerous variations and embodiments will be apparent in light of the present disclosure.

Fins 102 of different channel widths (Wsi) can benefit from methodologies of the present disclosure by facilitating consistent alignment of the cavity spacer along the channel. In some embodiments, one or more first fins 102 has a first channel width and one or more second fins 102 have a second channel width. In one embodiment, the first channel width and the second channel width can be from 5 nm to 100 nm. The first channel width may be 1.5×, 2×, 3×, 4×, 5×, 10×, 20×, or some other multiple of the second channel width (or vice versa). Similarly, the first channel width may differ from the second channel width from 2-10 nm, from 10-20 nm, from 20-50 nm, or from 50-100 nm. In one example, a first portion of the integrated circuit includes fins 102 with a first channel width from 5-20 nm and fins 102 with a second channel width from 25-50 nm.

In some embodiments, channel material 113 may be different in fins 102 formed on different areas of the substrate, such as for CMOS applications, for example. For instance, a first layer of channel material 113 may be formed on a first area of a silicon base 115 to be used for one or more p-channel transistor devices (e.g., one or more PMOS devices) and a second layer of channel material 113 may be formed on a second area of the silicon base 115 to be used for one or more n-channel transistor devices (e.g., one or more NMOS devices). Different channel materials 113 may be combined with differences in channel width, in accordance with some embodiments. For example, a first plurality of fins 102 has a first channel material 113 and a first channel width; a second plurality of fins 102 has a second channel material 113 compositionally different from the first channel material 113, and a second channel width different from the first channel width.

A dummy gate structure 130 on the base 115 extends over each fin 102 in a direction perpendicularly to the fins 102. As shown in FIGS. 5A-5C, the dummy gate structure 130 has a trigate configuration and contacts the opposite sides and top surface of the fins 102. In one example, the dummy gate structure 130 includes a hard mask 160 on the top surface of the dummy gate. The hard mark 160 is selected to endure and protect the dummy gate material (e.g., polysilicon) from etch processing that removes exposed regions of the layer stack 104.

In some embodiments, the base 115 is or includes a Group IV semiconductor material, such as single-crystal silicon or germanium. In other embodiments, the base 115 is or includes Group III-V semiconductor material, such as GaAs, InGaAs, AlGaAs, or AlAs, to name a few examples. In some embodiments, the base 115 may or may not be doped with a suitable dopant (e.g., boron, phosphorous, and/or arsenic). In embodiments where the base 116 is doped, it may be n-type doped (e.g., with phosphorous or arsenic) or p-type doped (e.g., with boron) at a dopant concentration in the range of 1E16 to 1E22 atoms per cubic cm, for example. In some embodiments, the subfins may have a multilayer structure including two or more distinct layers (that may or may not be compositionally different). In some embodiments, the subfins may include grading (e.g., increasing and/or decreasing) of one or more material concentrations throughout at least a portion of the subfin material.

The base 110 in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, the base may be doped with any suitable n-type and/or p-type dopant at a dopant concentration in the range of 1E16 to 1E22 atoms per cubic cm, for example. For instance, a silicon base can be p-type doped using a suitable acceptor (e.g., boron) or n-type doped using a suitable donor (e.g., phosphorous, arsenic) with a doping concentration of at least 1E16 atoms per cubic cm. However, in some embodiments, the base may be undoped/intrinsic or relatively minimally doped (such as including a dopant concentration of less than 1E16 atoms per cubic cm), for example. In some embodiments, the base is a silicon substrate consisting essentially of Si. In other embodiments, the base may primarily include Si but may also include other material (e.g., a dopant at a given concentration). Also, note that the base material may include relatively high quality or device-quality monocrystalline Si or other material that provides a suitable template or seeding surface from which other monocrystalline semiconductor material features and layers can be formed. Therefore, unless otherwise explicitly stated, a base as described herein is not intended to be limited to a base that only includes Si.

In some embodiments, the base may have a crystalline orientation described by a Miller index of (100), (110), or (111), or its equivalents, as will be apparent in light of this disclosure. Although the base in this example embodiment is shown for ease of illustration as having a thickness (dimension in the Y-axis direction) similar to that of other layers in the figures, the base may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the base may include a multilayer structure including two or more distinct layers that may or may not be compositionally different. In some embodiments, the base may include grading (e.g., increasing and/or decreasing) of one or more material concentrations throughout at least a portion of the material. In some embodiments, the base may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

The layer stack 104 can be formed directly on the base 115, starting with a layer of sacrificial material 120, followed by a layer of the channel material 113, and then followed by optional additional layer pairs of sacrificial material 120 and channel material 113. Optionally, a top layer of sacrificial material 120 is on top of the top layer of channel material 113. For example, the first (bottom) layer on the base 115 is the sacrificial material and the last (top) layer is also the sacrificial material, thereby providing layers of the channel material 113 between layers of the sacrificial material 120. In one example embodiment, the base is bulk monocrystalline silicon (Si), the sacrificial material 120 is silicon germanium (SiGe), and the channel material 113 is silicon doped with a suitable dopant and concentration. In another example, the base 150 is graphene, the sacrificial material 120 is gallium, and the channel material 113 is gallium arsenide (GaAs). Other material combinations can also be used, as will be appreciated. For instance, in an example embodiment, a given channel layer may include alternating layers of group IV and group III-V semiconductor material, where either the group IV or group III-V material is sacrificial, to enable the formation of one or more nanowires. In some embodiments, a given layer of channel material may include a vertical channel height (dimension in the Y-axis direction) in the range of 5 nm to 50 nm (or in a subrange of 5-45, 5-40, 5-35, 5-30, 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example. Other suitable materials and channel height requirements or thresholds will be apparent in light of this disclosure.

Layer stacks 104 can be formed using any suitable processing, such as one or more deposition or epitaxial growth processes of blanket layers, followed by patterning and etching to form the blanket layers into fins, as will be apparent in light of this disclosure. In one embodiment, alternating layers of sacrificial material 120 and channel material 113 can be formed as blanket layers on the base 115 using layer-by-layer epitaxial growth. Each fin can have a vertical fin height (dimension in the Y-axis direction) in the range of 10-500 nm (or in a subrange of 10-50, 20-100, 20-200, 20-300, 20-400, 50-100, 50-200, 50-300, 50-400, 50-500, 100-250, 100-400, 100-500, 200-400, or 200-500 nm) and/or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

Method 200 of FIG. 3 optionally continues with implanting 204 the source/drain regions with a neutral dopant or implant species. Such processing is useful to convert single crystal materials into amorphous material by breaking bonds in the lattice structure of the material. For example, when the layer of sacrificial material is monocrystalline silicon germanium (SiGe) as deposited, molecules of silicon, germanium, or argon can be implanted into the exposed source/drain regions 120. Species already present in the composition, or other neutral dopant molecules, can be used in the implantation 204 process. Such implantation 204 process results in amorphous materials in the source/drain region 120 that etch much faster than the monocrystalline form of the same material present in the channel region 110. The enhanced etch rate of the amorphous material facilitates removal of the source/drain material with minimal effect on the sacrificial material 120 under the dummy gate structure 150. Accordingly, in nanowire devices of different channel widths, the sacrificial material 120 (e.g., SiGe) in the channel region 110 can be more uniformly recessed to the edge of the dummy gate (e.g., polysilicon). In the event of over etching the sacrificial material 120 in subsequent processing, the extent of the over etch (into the channel region 110) is reduced. In some embodiments, implanting 204 the source/drain regions 102 obviates the need for separate deposition of the gate spacer portion 156 and cavity spacer portion 157 of the gate spacer 155. For example, due to the enhanced etch rate of the implanted material, the sacrificial material 120 is sufficiently aligned with the end of the channel material 113 in the channel region 110 (i.e., under the dummy gate). Thus, implanting 104 the source/drain regions 120 can enable method 200 to omit multi-step gate spacer processing and instead form a gate spacer in a single process. As such, method 200 proceeds in some embodiments to forming 206 a gate spacer, removing 208 the source/drain regions, and then skipping to epitaxial formation 219 of the final source/drain materials. In embodiments of method utilizing implantation 204, the base 115 may contain residual implant species below the final source/drain region 120.

Figure 6:
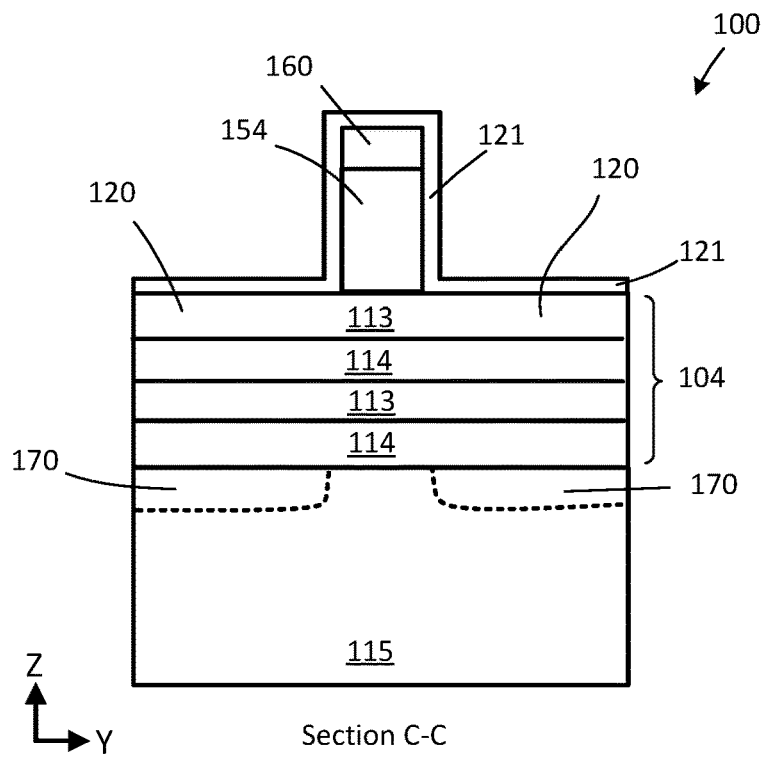
FIG. 6 is a cross-sectional view of a semiconductor structure showing a spacer material on the fin and gate structure, in accordance with an embodiment of the present disclosure.

In embodiments of method 200 not utilizing implantation 204, or embodiments utilizing implantation 204 as an additional process, method 200 of FIG. 3 continues 206 with forming 206 a layer of spacer material over the structure of FIG. 5A-5C. For example, the layer of spacer material is deposited on the dummy gate stack, on the layer stack, and on the exposed base 115. FIG. 6 is a cross-sectional view taken along line C-C of FIG. 5A and shows the semiconductor structure 100 of FIG. 5C with the addition of the material of the gate spacer portion 157. FIG. 6 shows an implanted region 170 in the base 115, as may exist when performing some embodiments of the implantation 204 process.

Figure 7:
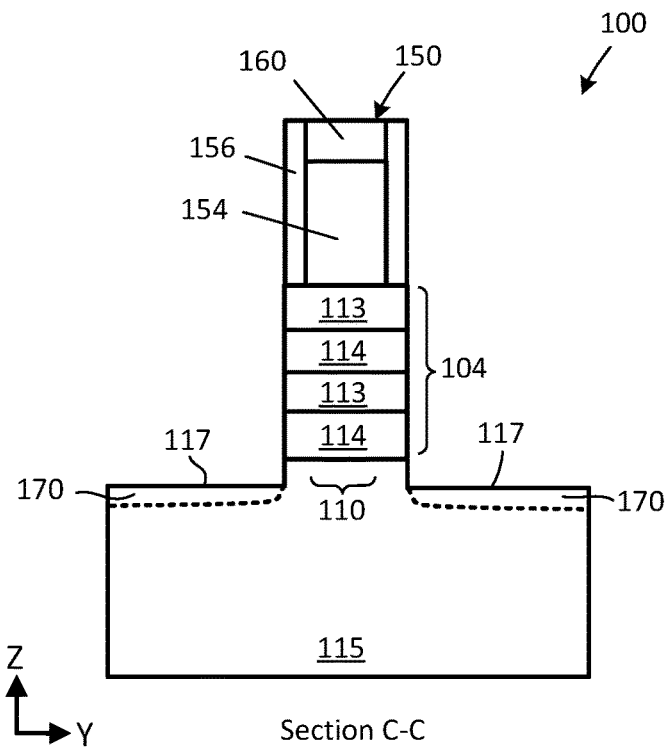
FIG. 7 is a cross-sectional view of the semiconductor structure of FIG. 6 after removing the source and drains, in accordance with an embodiment of the present disclosure.

Method 200 of FIG. 3 continues with removal 208 of the source/drain regions of the fin 102. Using an anisotropic etch, for example, the layer stack 104 in the S/D regions is etched to the base 115. FIG. 7 is a cross sectional view taken along line C-C of FIG. 5A, showing the layer stack 104 below the gate structure 150 after removing 208 the source/drain regions 120. The channel region 110 of the fin 102 remains intact below the dummy gate structure 150, which includes a dummy gate electrode 154 with a hardmask 160 on its top surface, and a gate spacer portion 156 of the gate spacer along opposite faces of the dummy gate electrode 154. The sacrificial material 114 is illustrated as being aligned with opposite ends of the channel material 113, which may be the case when the source/drain regions are implanted to cause rapid etch removal of those materials. When an anisotropic etch is used to remove 208 the source/drain, the sacrificial material 114 in the channel region is minimally affected by the etch process. In some embodiments, however, the etch process to remove 208 the source/drain regions 120 may slightly recess the sacrificial material 114 into the channel region 110. In order to completely remove the materials of the source/drain region 120, a trench 117 is often created in the base 115 unless the etch process can be controlled to stop after removing the sacrificial material 114. Absent a base 115 material that is substantially inert to the etch process used to remove the source/drain regions 120, a trench 117 often results. In embodiments where the source/drain regions are implanted, an implanted region 170 may remain below and/or to the sides of the trench 117.

Method 200 of FIG. 3 continues with recessing 210 the sacrificial material 114 in the channel region 110. In one embodiment, the sacrificial material 114 is recessed 210 laterally to about the vertical boundary between the dummy gate electrode 154 and the gate spacer portion 156 of the gate spacer. FIGS. 8A-8C illustrate a perspective view, a cross-sectional view taken along line B-B of FIG. 8A, and a cross-sectional view taken along line C-C of FIG. 8A, respectively. Trenches 117 have been formed in the base 115 as a result of removing 208 portions of the fin 102 corresponding to the source/drain regions 120 in previous processes. The sacrificial material 114 remains below each layer of channel material 113 in the channel region 110 below the dummy gate electrode 156, but has been undercut to define a cavity 118 between end portions of the channel material 113, such as shown in FIG. 8C. These cavities 118 can be filled with spacer material in subsequent processing as part of the gate spacer.

Having recessed the sacrificial material 114, the semiconductor structure 100 is ready for deposition of the cavity spacer material. In one embodiment, the material of the gate spacer portion 156 is first removed, followed by deposition of a relatively thick layer of spacer material that will be used for both the gate spacer portion 156 and the cavity spacer portion 157. In another embodiment, a layer of cavity spacer material is deposited over the structure shown, for example, in FIGS. 8A-8C, where the cavity spacer material fills the cavities 118 between the end portions of the channel material 113 under the dummy gate structure 150. Each of these embodiments will be discussed below in more detail.

Figure 9:
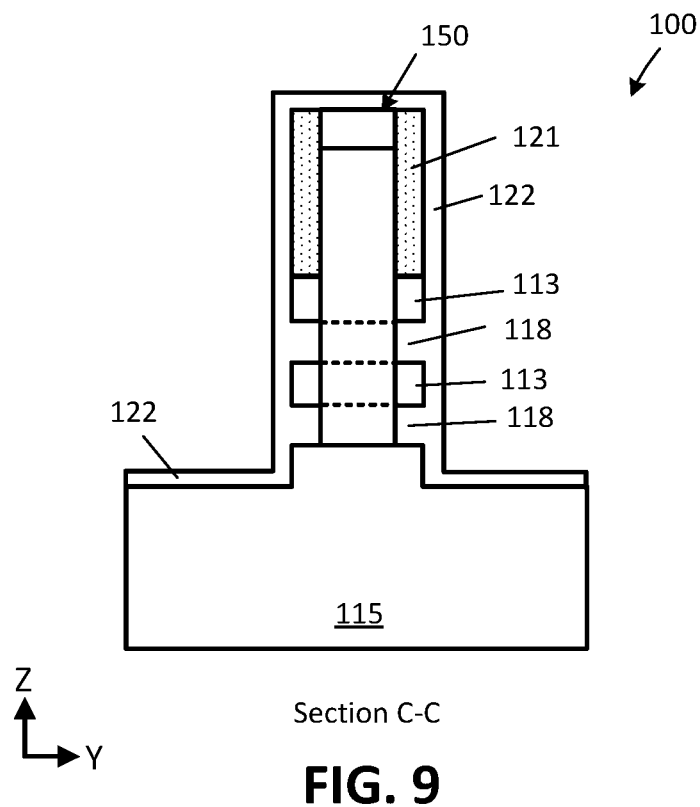
FIG. 9 illustrates a cross-sectional view of the semiconductor structure of FIG. 8C after depositing a second layer of spacer material, in accordance with an embodiment of the present disclosure.
Figure 10:
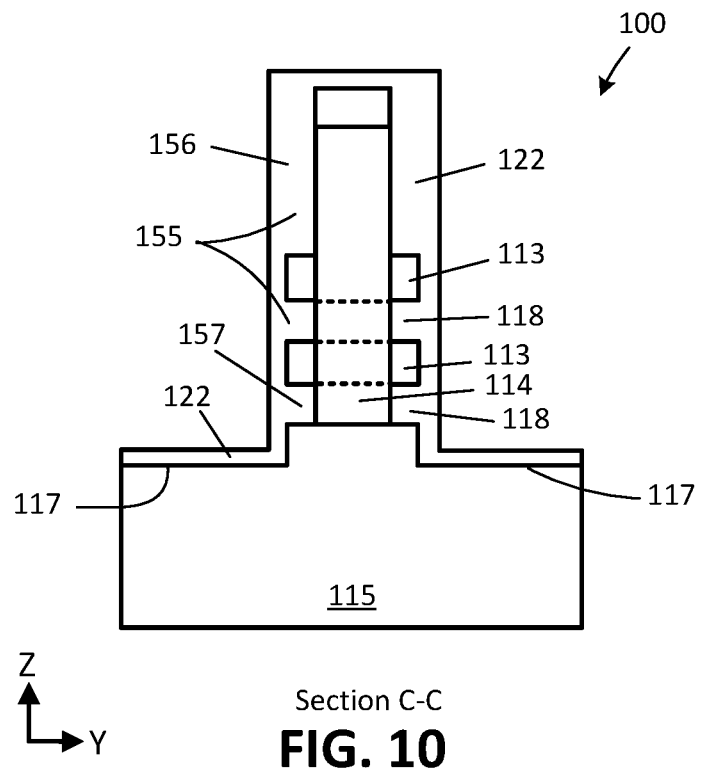
FIG. 10 illustrates a cross-sectional view of the semiconductor structure of FIG. 8C after removing the first layer of spacer material and depositing a second layer of spacer material, in accordance with an embodiment of the present disclosure.

Referring to the left-side option of the flowchart in FIG. 3, one embodiment of method 200 continues with conformally depositing 212 a second layer of spacer material on exposed surfaces. The spacer material is deposited on the sides and top of the gate structure, on the top surface of the base, and fills cavities between channel material under the gate. FIG. 9 shows a cross-sectional view of an example structure that includes a second layer of spacer material deposited over the structure shown in FIG. 8C. The layer of second spacer material 122 is on all exposed surfaces of the structure 100, including the top and sides of the dummy gate structure 150 and top surface of the base 115. The layer of second spacer material 122 fills cavities 118 between end portions of the channel material 113 in the channel region 110. The second spacer material 122 is also on the first spacer material 121 along the sides of the dummy gate structure 150. In some embodiments, the second spacer material 122 is compositionally different from the first spacer material 121. In other embodiments, the second spacer material 122 is the same as the first spacer material 121.

Referring to the right-side option of the flowchart in FIG. 3, another embodiment of method 200 continues with removing 213 the first spacer material 121, followed by deposition 215 of a second spacer material 122. Removal 213 of the first spacer material 121 can be performed using any suitable wet or dry etch processing, including isotropic wet/dry etch processing. The second spacer material 122 can be deposited 215 conformally to exposed surfaces in a relatively thick layer to form both the gate spacer portion 156 and the cavity spacer portion 157 of the gate spacer 155. The second cavity material 122 is on the top and sides of the dummy gate structure 150, the top of the base 115 (including in trenches 117), and in the cavities 118 between end portions of the channel material 113.

After depositing the second spacer material 122, whether over first spacer material 121 or after removing the first spacer material 121, the second spacer material 122 is etched 216 to expose the ends of the channel material 113. For example, an anisotropic etch process is used to etch 216 down through the second spacer material 122. FIG. 11A illustrates a perspective view of one example of the resulting semiconductor structure 100. FIG. 11B is a cross-sectional view taken along line B-B of FIG. 11A, and FIG. 11C is a cross-sectional view taken along line C-C of FIG. 11A. In this example, the dummy gate structure 150 includes gate spacer portions 156 of the first spacer material 121, and cavity spacer portions 157 of the second spacer material 122. Ends of the channel material 113 are exposed at the lateral surface of the gate spacer 155. The second spacer material 122 has been removed from the trenches 117 in the base 115, although this is not always the case. When following process 212 using a first spacer material 121 and second spacer material 122, the second spacer material 122 can be deposited in a thinner layer, therefore increasing the likelihood that the second spacer material 122 will be completely removed from the trenches 117 when etching 216 the second spacer material 122.

Figure 12A:
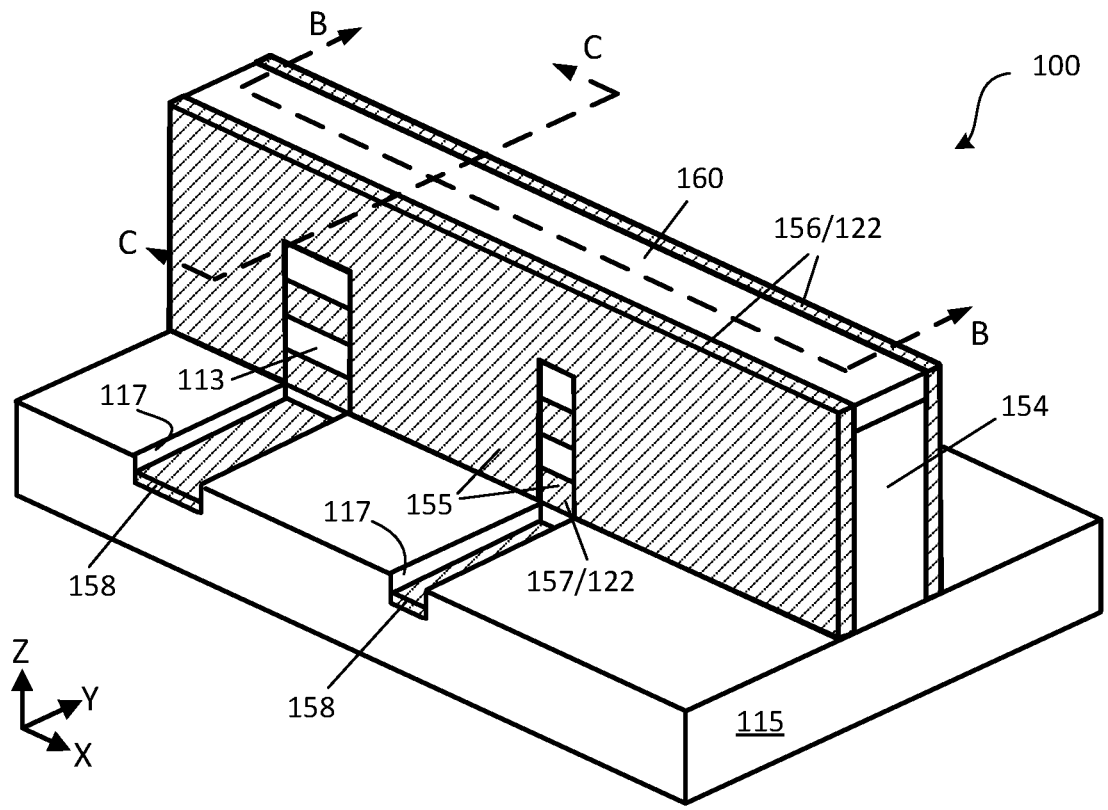
FIG. 12A illustrates a perspective view of the semiconductor structure of FIG. 10 after etching back the second layer of spacer material, in accordance with an embodiment of the present disclosure.
Figure 12B:
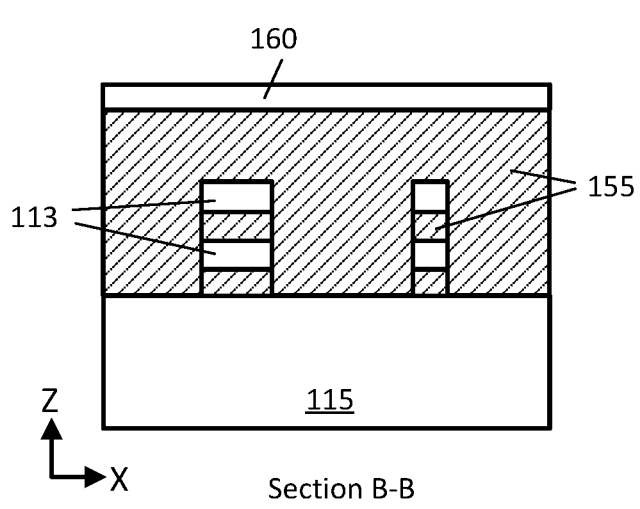
FIG. 12B illustrates a cross-sectional view of the semiconductor structure of FIG. 12A taken along line B-B, in accordance with an embodiment of the present disclosure.
Figure 12C:
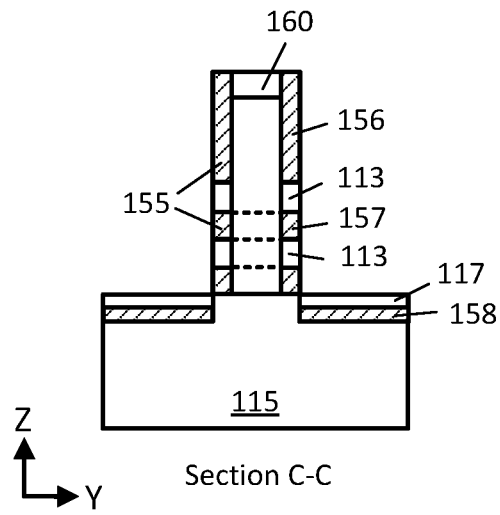
FIG. 12C illustrates a cross-sectional view of the semiconductor structure of FIG. 12A taken along line C-C, in accordance with an embodiment of the present disclosure.

FIGS. 12A-12C illustrates another example of the resulting semiconductor structure 100 after etching 216 the second spacer material 122. FIG. 12A is a perspective view, FIG. 12B is a cross-sectional view taken along line B-B of FIG. 12A, and FIG. 12C is a cross-sectional view taken along line C-C of FIG. 12A. In this example, the dummy gate structure 150 includes gate spacer portions 156 and cavity spacer portions 157, both formed of the second spacer material 122. Ends of the channel material 113 are exposed at the surface of the gate spacer 155. A residual layer 158 of second spacer material 122 remains in trenches 117 in the base 115. When following process 213-215 of removing the first spacer material 121 followed by deposition of the second spacer material 122, the second spacer material 122 is generally deposited in a thicker layer in order to fill cavities 118, therefore increasing the likelihood that the second spacer material 122 is not completely removed from the trenches 117 when etching 216 the second spacer material 122.

Method 200 continues with forming 218 the replacement source/drain structures. Forming 218 replacement source and drain material can be performed using any suitable techniques, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In some embodiments, the source and drain regions may be formed one polarity at a time, such as processing one of n-type and p-type regions, and then processing the other of the n-type and p-type regions. In some embodiments, the source and drain regions may include any suitable doping scheme, such as including suitable n-type and/or p-type dopant (e.g., in a concentration in the range of 1E16 to 1E22 atoms per cubic cm). However, in some embodiments, at least one source or drain region may be undoped/intrinsic or relatively minimally doped, such as including a dopant concentration of less than 1E16 atoms per cubic cm, for example.

Method 200 of FIG. 3 continues with completing 220 the transistor structure. FIG. 4 illustrates an example process flow for completing 220 the transistor structure in some embodiments, including removing 222 the dummy gate structure, removing 224 sacrificial material between the nanowires, replacement gate processing 226, source/drain contact processing 228, and completing 230 an integrated circuit.

In one embodiment, completing 220 the transistor may begin with removing 222 the dummy gate electrode between the gate spacers to expose the channel region of the fin. For example, the hardmask is removed using an etch process suitable to the material of the hardmask. The dummy gate electrode (e.g., polysilicon) can then be removed using a wet etch process (e.g., nitric acid/hydrofluoric acid), an anisotropic dry etch, or other suitable etch process, as will be appreciated. At this stage of processing, the layer stack of channel material and sacrificial material is exposed in the channel region, and ends of the layer stack are protected by the spacer material. The sacrificial material in the layer stack can then be removed by etch processing to release nanowires of channel material that extend between and contact the source and drain regions.

After releasing the nanowires, method 200 continues with processing 226 the final gate stack, in accordance with some embodiments. In one example, the final gate stack is formed using a gate-last fabrication flow, which may be considered a replacement gate or replacement metal gate (RMG) process. In embodiments that utilize a nanowire channel structure, the gate stack substantially (or completely) surrounds each nanowire body portion in the channel region. For example, the gate stack wraps around at least 80, 85, 90, 95% or more of each nanowire body between the gate spacers. Processing 226 the final gate stack includes depositing a gate dielectric on the exposed nanowire bodies in the channel region, followed by formation of a gate electrode on the gate dielectric. Any suitable technique can be used, including spin-coating or CVD deposition, for example. The gate dielectric may include, for example, any suitable oxide (such as silicon dioxide), high-k dielectric material, and/or any other suitable material as will be apparent in light of this disclosure. Examples of high-k dielectric materials include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric can be annealed to improve its quality when high-k dielectric material is used. The gate electrode may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric and/or gate electrode include a multilayer structure of two or more material layers, for example. For instance, in some embodiments, a multilayer gate dielectric may be employed to provide a more gradual electric transition from the channel region to the gate electrode. In some embodiments, the gate dielectric and/or gate electrode may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Numerous different gate stack configurations will be apparent in light of this disclosure.

FIGS. 13A-13C illustrate an example semiconductor structure 100 after processing 226 the final gate stack. FIG. 13A is a perspective view, FIG. 13B is a cross-sectional view taken along line B-B of FIG. 13A, and FIG. 13C is a cross-sectional view taken along line C-C of FIG. 13A. The source/drain regions 120 contact ends of the nanowires 112 extending from the channel region 110, and occupy the notch 117 in the base 115. In this example, the source/drain 120 material contacts the base 115 without an intervening residual layer of spacer material; however, in other embodiments, the notch 117 may contain a residual layer of spacer material as will be discussed below with reference to FIGS.

14A-14C. The gate dielectric 152 and gate electrode 154 of the gate structure 150 surround each nanowire 112, where the gate dielectric 152 is between the gate electrode 154 and the nanowire 112. The example structure of FIGS. 13A-13C is illustrated without a layer of interlayer dielectric (ILD) on the base and extending up to the top of the gate structure 150. Such a layer would likely be present for subsequent processing, such as formation of source and drain contacts, as will be appreciated.

FIGS. 14A-14C illustrate another example semiconductor structure 100 after processing 226 the final gate stack. FIG. 14A is a perspective view, FIG. 14B is a cross-sectional view taken along line B-B of FIG. 14A, and FIG. 14C is a cross-sectional view taken along line C-C of FIG. 14A. The source/drain regions 120 contact ends of the nanowires 112 extending from the channel region 110, and occupy the notch 117 in the base 115. In this example, the source/drain 120 material contacts a residual layer 158 of spacer material in the notch 117. In this example, the spacer material in the notch 117 is the same as that found in the cavity spacer portion 157 between ends of nanowires 112, and the same as that found in the gate spacer portion 156. The gate dielectric 152 and gate electrode 154 of the gate structure 150 surround each nanowire 112, where the gate dielectric 152 is between the gate electrode 154 and the nanowire 112. The example structure of FIGS. 14A-14C is illustrated without a layer of interlayer dielectric (ILD) on the base and extending up to the top of the gate structure 150. Such a layer would likely be present for subsequent processing, such as formation of source and drain contacts, as will be appreciated.

Method 200 continues with forming 228 source/drain contacts. In some embodiments, the source and drain contacts can be formed 228 using any suitable techniques, such as forming contact vias in an ILD layer over the respective source/drain regions and then depositing metal or metal alloy (or other suitable electrically conductive material) in the vias. In some embodiments, forming 228 source/drain contacts may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance-reducing metal and a contact plug metal, or just a contact plug metal, for instance. Examples of contact resistance-reducing metals include nickel, aluminum, titanium, gold, gold-germanium, nickel-platinum, nickel aluminum, and/or other such resistance-reducing metals or alloys. Examples of contact plug metals include aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance-reducing layer may be present between a given source or drain region and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance-reducing layer may include semiconductor material and/or impurity dopants based on the included material and/or dopant concentration of the corresponding source or drain region, for example.

Method 200 continues with completing 230 a general integrated circuit (IC) as desired, in accordance with some embodiments. Such additional processing to complete an IC may include back-end or back-end-of-line (BEOL) processing to form one or more metallization layers and/or to interconnect the transistor devices formed, for example.

Method 200 can include any other suitable processing, as will be apparent in light of this disclosure. Note that the processes in method 200 are shown and described in a particular order for ease of description. However, one or more of the processes may be performed in a different order or may not be performed at all (and thus be optional), in accordance with some embodiments. Numerous variations on method 200 and the techniques described herein will be apparent in light of this disclosure.

A multitude of different transistor devices can benefit from the techniques described herein, including, but is not limited to, various field-effect transistors (FETs) having a gate-all-around (GAA) configuration, such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, nanowire finFET devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices. In general, the techniques allow transistors to be further scaled with diverse channel materials, while ensuring higher operating voltage, higher drive currents, and thereby improved performance.

Example System

Figure 15:
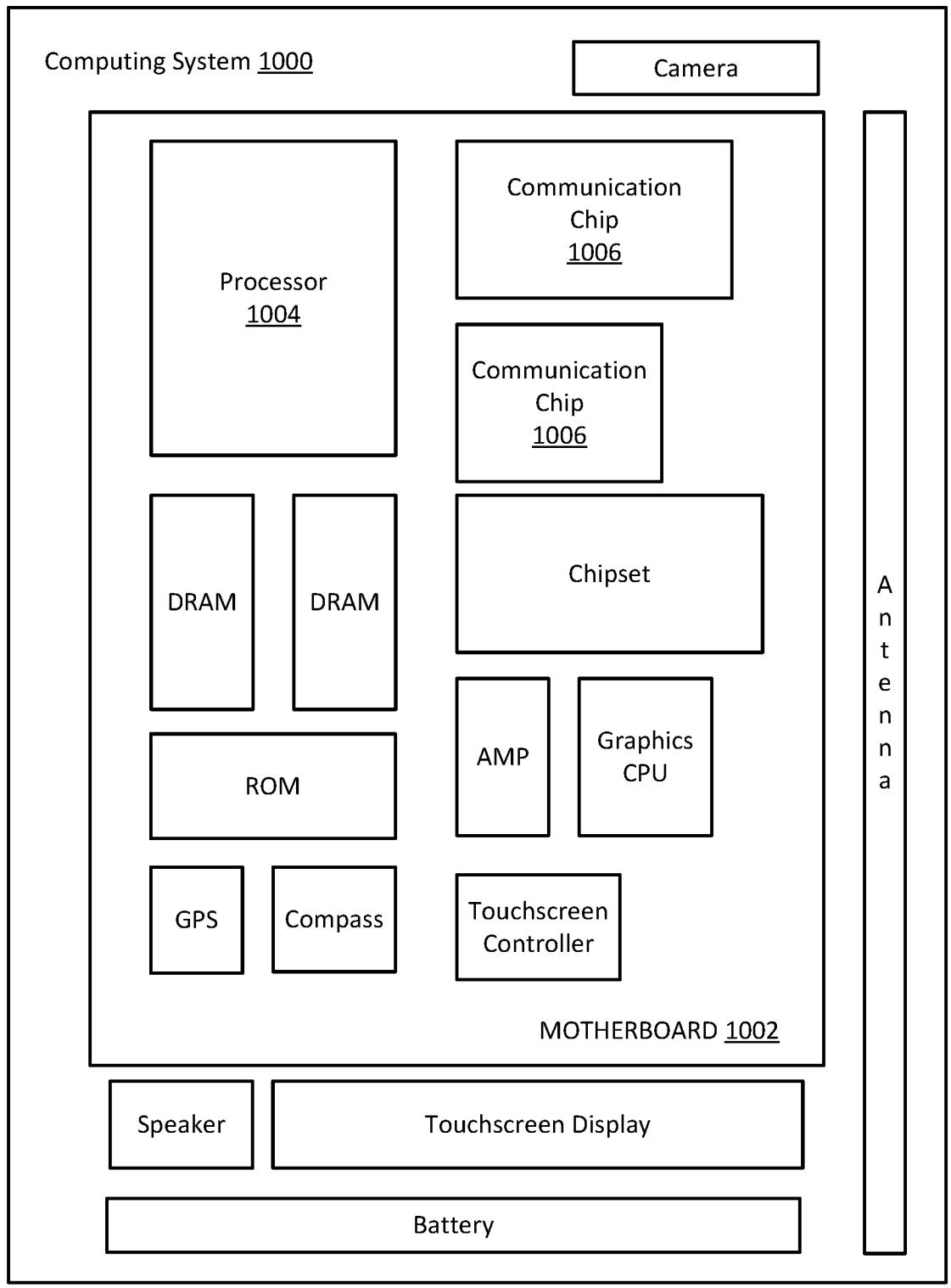
FIG. 15 illustrates an example computing system implemented with integrated circuit structures and/or transistor devices formed in accordance with some embodiments of the present disclosure.

FIG. 15 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is a semiconductor structure comprising a base; a body over the base, the body comprising a semiconductor material, the body being in the form of a nanowire, nanoribbon or nanosheet and having a first end portion and a second end portion; a gate structure wrapped around the body between the first end portion and the second end portion, the gate structure comprising a gate electrode and a gate dielectric between the gate electrode and the body; a source region laterally adjacent to and in contact with the first end portion; a drain region laterally adjacent to and in contact with the second end portion; a first spacer material on opposite sides of the gate structure, the first spacer material above the first end portion of the body; and a second spacer material on opposite sides of the gate structure and under the first end portion of the body; wherein either (i) the second spacer material is compositionally different from the first spacer material, or (ii) the second spacer material is the same as the first spacer material, the second spacer material further being vertically below and in contact with a bottom surface of the source region, and vertically below and in contact with a bottom surface of the drain region.

Example 2 includes the subject matter of Example 1, wherein the second spacer material is compositionally different from the first spacer material.

Example 3 includes the subject matter of Example 1 wherein the second spacer material is the same as the first spacer material, the second spacer material further being vertically below and in contact with a bottom surface of the source region, and vertically below the drain and in contact with a bottom surface of the drain region.

Example 4 includes the subject matter of any of Examples 1-3, wherein the body is a first body of two or more bodies extending horizontally between the source region and the drain region.

Example 5 includes the subject matter of Example 4, wherein the two or more bodies are arranged in a spaced-apart vertical stack and the first spacer material is below the first end portion of one or more of the two or more nanowire bodies.

Example 6 includes the subject matter of any of Examples 1-5, wherein the body is a nanoribbon.

Example 7 is an integrated circuit comprising a base; a first transistor structure with a first source on the base, a first drain on the base, a first body of a first width extending over the base between the first source and the first drain, and a first gate structure wrapped around the first body between first and second end portions of the first body, wherein the first gate structure includes a first gate electrode and a first gate dielectric between the gate electrode and the first body; a second transistor structure with a second source on the base, a second drain on the base, a second body of a second width extending over the base between the second source and the second drain, and a second gate structure wrapped around the second body between first and second end portions of the second body, wherein the second gate structure includes a second gate electrode and a second gate dielectric between the gate electrode and the second body; a first spacer material in contact with the first gate structure above the first end portion of the first body, and in contact with the second gate structure above the first end portion of the second body; and a second spacer material below the first end portion of the first body and below the first end portion of the second body, the second spacer material adjacent the gate structure being colinear with the first spacer material adjacent the gate structure in the first transistor structure and in the second transistor structure.

Example 8 includes the subject matter of Example 7, wherein the second width is at least twice the first width.

Example 9 includes the subject matter of Example 7, wherein the second width is at least five times the first width.

Example 10 includes the subject matter of Example 7, wherein the second width is at least ten times the first width.

Example 11 includes the subject matter of any of Examples 7-10, wherein the first body is a nanowire and the second body is a nanoribbon or nanosheet.

Example 12 includes the subject matter of any of Examples 7-11, wherein the first spacer material is compositionally different from the second spacer material.

Example 13 includes the subject matter of any of Examples 7-12, wherein the base defines recesses below the source and drain of the first transistor structure and below the source and drain of the second transistor structure, the second spacer material being in the recesses below the source and drain of the first transistor structure and below the source and drain of the second transistor structure.

Example 14 includes the subject matter of any of Examples 7-13, wherein in the first transistor structure and the second transistor structure, the second spacer material is vertically below and in contact with a bottom surface of the source region, and vertically below and in contact with a bottom surface of the drain region.

Example 15 includes the subject matter of any of Examples 7-14, wherein the second spacer material has a first lateral thickness to the gate structure in the first transistor structure and a second lateral thickness to the gate structure in the second transistor structure, the first lateral thickness differing from the second lateral thickness no more than 1 nm.

Example 16 includes the subject matter of Example 15, wherein the first lateral thickness differs from the second lateral thickness no more than 0.5 nm.

Example 17 includes the subject matter of any of Examples 7-16, wherein the first body is one of two or more bodies in a first vertical stack of bodies and the second body is one of two or more bodies in a second vertical stack of bodies.

Example 18 is a method of forming a nanowire transistor, the method comprising providing a semiconductor structure with a fin on a base, the fin having a layer stack with alternating layers of a semiconductor material and a sacrificial material, the semiconductor structure also including a dummy gate electrode on the fin between a source region and a drain region of the fin; depositing a first layer of spacer material; removing the source region and drain region of the fin, leaving a portion of the layer stack under the dummy gate electrode; etching back the sacrificial material to define cavities below end portions of the semiconductor material in the portion of the layer stack under the dummy gate electrode; depositing a second spacer material in the cavities; etching the second spacer material to expose ends of the semiconductor material in the portion of the layer stack under the dummy gate electrode; and forming a replacement source and a replacement drain in contact with ends of the semiconductor material in the portion of the layer stack under the dummy gate electrode.

Example 19 includes the subject matter of Example 18 and further comprises removing the first layer of spacer material prior to depositing the second layer of spacer material.

Example 20 includes the subject matter of Example 18 or 19, wherein depositing the second spacer material includes selecting the second spacer material to be compositionally different from the first spacer material.

Example 21 includes the subject matter of any of Examples 18-20, wherein removing the source region and the drain region defines recesses in the base, and forming the replacement source and the replacement drain includes forming a bottom surface of the replacement source in one of the recesses and a bottom surface of the replacement drain in another one of the recesses.

Example 22 includes the subject matter of Example 21, wherein etching back the second spacer material includes leaving a residual layer of the second spacer material in the recesses in the base.

Example 23 includes the subject matter of any of Examples 18-22 and further comprises removing the dummy gate structure; releasing nanowires of the semiconductor material in the channel region; and forming a replacement gate structure wrapping around the nanowires in the channel region.

Example 24 includes the subject matter of any of Examples 18-23 and further comprises forming a source contact on the replacement source; and forming a drain contact on the replacement drain.

Example 25 includes the subject matter of any of Examples 18-24 and further comprises implanting a dopant into the source region and the drain region.

Example 26 includes the subject matter of Example 25, wherein implanting the dopant includes selecting the dopant as a species found in the semiconductor material, a species found in the sacrificial material, or an inert species.

Example 27 includes the subject matter of any of Examples 18-26, wherein providing the semiconductor structure includes providing a first semiconductor structure with a first fin of a first fin width, and providing a second semiconductor structure with a second fin of a second find width different from the first fin width.

Example 28 includes the subject matter of Example 27, wherein etching back the sacrificial material to define cavities includes defining cavities that extend laterally to within a predefined lateral distance from an edge of the channel region vertically below the dummy gate electrode.

Example 29 includes the subject matter of Example 28, wherein the predefined lateral distance is less than 2 nm.

Example 30 includes the subject matter of Example 28, wherein the predefined lateral distance is less than 1 nm.

Example 31 includes the subject matter of Example 28, wherein the predefined lateral distance is less than 0.5 nm.

Example 32 is an integrated circuit comprising a first body with a first body width and having a first end portion and a second end portion; a second body with a second body width greater than the first body width, the second body having a first end portion and a second end portion; a gate structure wrapped around the first body and the second body between the first end portion and the second end portion, the gate structure comprising a gate electrode and a gate dielectric; a source in contact with the first end portion of the first body and the first end portion of the second body; a drain in contact with the second end portion of the first body and the second end portion of the second body; a gate spacer laterally adjacent the gate structure above the first end portion of the first body and of the second body, the gate spacer comprising a first spacer material; and a cavity spacer below the first end portion of the first body and below the first end portion of the second body, the cavity spacer comprising a second spacer material.

Example 33 includes the subject matter of Example 32, wherein the first cavity spacer and the second cavity spacer have a uniform lateral thickness.

Example 34 includes the subject matter of Example 32 or 33, wherein the first spacer material is compositionally different from the second spacer material.

Example 35 includes the subject matter of Example 34, wherein the second spacer material is below and in contact with a bottom surface of the source, and below and in contact with a bottom surface of the drain.

Example 36 includes the subject matter of any of Examples 32-35, wherein the cavity spacer is colinear with the gate spacer above the first end portion of the first body and colinear with the gate spacer above the first end portion of the second body.

Example 37 includes the subject matter of any of Examples 32-36, wherein the first body is one of two or more bodies in a first vertical stack of bodies and the second body is one of two or more bodies in a second vertical stack of bodies.

Example 38 includes the subject matter of any of Examples 32-37, wherein the first body is a nanowire and the second body is a nanoribbon or nanosheet.

Example 39 includes the subject matter of any of Examples 32-38, wherein the second width is at least twice the first width.

Example 40 includes the subject matter of Example 39, wherein the second width is at least five times the first width.

Example 41 includes the subject matter of Example 39, wherein the second width is at least ten times the first width.

Example 42 is an integrated circuit comprising a nanowire with a first width; a nanoribbon with a second width greater than the first width; a gate structure wrapped around the nanowire and around the nanoribbon; a source in contact with the first end portion of the nanowire and a first end portion of the nanoribbon; a drain in contact with a second end portion of the nanowire and with a second end portion of the nanoribbon; a gate spacer of a first material positioned laterally adjacent the gate structure above the first end portion of the nanowire and above the first end portion of the nanoribbon; a first cavity spacer of a second material positioned below the first end portion of the nanowire; and a second cavity spacer of the second material positioned below the first end portion of the nanoribbon.

Example 43 includes the subject matter of Example 42, wherein the first cavity spacer and the second cavity spacer have a uniform lateral thickness.

Example 44 includes the subject matter of Example 42 or 43, wherein the first material is compositionally different from the second material.

Example 45 includes the subject matter of Example 44, wherein the second material is below and in contact with a bottom surface of the source, and below and in contact with a bottom surface of the drain.

Example 46 includes the subject matter of any of Examples 42-45, wherein the cavity spacer is colinear with the gate spacer above the first end portion of the nanowire and colinear with the gate spacer above the first end portion of the nanoribbon.

Example 47 includes the subject matter of any of Examples 42-46, wherein the first nanowire is one of two or more nanowires in a first vertical stack of nanowires and the nanoribbon is one of two or more nanoribbons in a vertical stack of nanoribbons.

Example 48 includes the subject matter of any of Examples 42-47, wherein the second width is at least twice the first width.

Example 49 includes the subject matter of Example 48, wherein the second width is at least five times the first width.

Example 50 includes the subject matter of Example 48, wherein the second width is at least ten times the first width.

Example 51 is an integrated circuit die comprising the semiconductor structure of any of claims 1-6 and/or the integrated circuit of any of claims 7-17 and 32-50.

Example 52 includes the subject matter of Example 51, wherein the integrated circuit die is a communication chip.

Example 53 includes the subject matter of Example 51, wherein the integrated circuit die is a touch screen controller.

Example 54 includes the subject matter of Example 51, wherein the integrated circuit die is a memory.

Example 55 is a computing system comprising the integrated circuit of any of claims 7-17 and 32-50.

Example 56 includes the subject matter of Example 55, wherein the integrated circuit is part of a communication chip.

Example 57 includes the subject matter of Example 55, wherein the integrated circuit is part of a touch screen controller.

Example 58 includes the subject matter of Example 55, wherein the integrated circuit is a memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising:
a base;
a body over the base, the body comprising a semiconductor material, the body being in the form of a nanowire, nanoribbon or nanosheet and having a first end portion and a second end portion;
a gate structure wrapped around the body between the first end portion and the second end portion, the gate structure comprising a gate electrode and a gate dielectric between the gate electrode and the body;
a source region laterally adjacent to and in contact with the first end portion;
a drain region laterally adjacent to and in contact with the second end portion;
a first spacer material on opposite sides of the gate structure, the first spacer material above the first end portion of the body;
a second spacer material on opposite sides of the gate structure and under the first end portion and the second end portion of the body, the second spacer material having a composition; and
a dielectric material layer beneath the source region and beneath the drain region and in contact with a bottommost surface of the source region and the drain region, the dielectric material layer having a composition the same as the composition of the second spacer material, and the dielectric material discontinuous with the second spacer material.

2. The integrated circuit structure of claim 1, wherein the body is a first body of two or more bodies extending horizontally between the source region and the drain region.

3. The integrated circuit structure of claim 2, wherein the two or more bodies are arranged in a spaced-apart vertical stack.

4. The integrated circuit structure of claim 1, wherein the body is a nanowire.

5. The integrated circuit structure of claim 1, wherein the body is a nanoribbon.

6. An integrated circuit structure, comprising:
a base;
a body over the base, the body comprising a semiconductor material, the body being in the form of a nanowire, nanoribbon or nanosheet and having a first end portion and a second end portion;
a gate structure wrapped around the body between the first end portion and the second end portion, the gate structure comprising a gate electrode and a gate dielectric between the gate electrode and the body;
a source region laterally adjacent to and in contact with the first end portion;
a drain region laterally adjacent to and in contact with the second end portion;
a first spacer material on opposite sides of the gate structure, the first spacer material above the first end portion of the body;
a second spacer material on opposite sides of the gate structure and under the first end portion and the second end portion of the body, the second spacer material further beneath the source region and beneath the drain region and in contact with a bottommost surface of the source region and the drain region, wherein a portion of the second spacer material beneath the source region is discontinuous with a portion of the second spacer material on opposite sides of the gate structure and under the first end portion and the second end portion of the body, and wherein a portion of the second spacer material beneath the drain region is discontinuous with a portion of the second spacer material on opposite sides of the gate structure and under the first end portion and the second end portion of the body.

7. The integrated circuit structure of claim 6, wherein the body is a first body of two or more bodies extending horizontally between the source region and the drain region.

8. The integrated circuit structure of claim 7, wherein the two or more bodies are arranged in a spaced-apart vertical stack.

9. The integrated circuit structure of claim 6, wherein the body is a nanowire.

10. The integrated circuit structure of claim 6, wherein the body is a nanoribbon.

11. A computing device, comprising:
a board; and
a component coupled to the board, the component including an integrated circuit structure, comprising:
a base;
a body over the base, the body comprising a semiconductor material, the body being in the form of a nanowire, nanoribbon or nanosheet and having a first end portion and a second end portion;
a gate structure wrapped around the body between the first end portion and the second end portion, the gate structure comprising a gate electrode and a gate dielectric between the gate electrode and the body;
a source region laterally adjacent to and in contact with the first end portion;
a drain region laterally adjacent to and in contact with the second end portion;
a first spacer material on opposite sides of the gate structure, the first spacer material above the first end portion of the body;
a second spacer material on opposite sides of the gate structure and under the first end portion and the second end portion of the body, the second spacer material having a composition; and
a dielectric material layer beneath the source region and beneath the drain region and in contact with a bottommost surface of the source region and the drain region, the dielectric material layer having a composition the same as the composition of the second spacer material and the dielectric material discontinuous with the second spacer material.

12. The computing device of claim 11, further comprising:
a memory coupled to the board.

13. The computing device of claim 11, further comprising:
a communication chip coupled to the board.

14. The computing device of claim 11, wherein the component is a packaged integrated circuit die.

15. The computing device of claim 11, wherein the component is selected from the group consisting of a processor, a communications chip, and a digital signal processor.

16. A computing device, comprising:
  a board; and
  a component coupled to the board, the component including an integrated circuit structure, comprising:
    a base;
    a body over the base, the body comprising a semiconductor material, the body being in the form of a nanowire, nanoribbon or nanosheet and having a first end portion and a second end portion;
    a gate structure wrapped around the body between the first end portion and the second end portion, the gate structure comprising a gate electrode and a gate dielectric between the gate electrode and the body;
    a source region laterally adjacent to and in contact with the first end portion;
    a drain region laterally adjacent to and in contact with the second end portion;
    a first spacer material on opposite sides of the gate structure, the first spacer material above the first end portion of the body;
    a second spacer material on opposite sides of the gate structure and under the first end portion and the second end portion of the body, the second spacer material having a composition, the second spacer material further beneath the source region and beneath the drain region and in contact with a bottommost surface of the source region and the drain region, wherein a portion of the second spacer material beneath the source region is discontinuous with a portion of the second spacer material on opposite sides of the gate structure and under the first end portion and the second end portion of the body, and wherein a portion of the second spacer material beneath the drain region is discontinuous with a portion of the second spacer material on opposite sides of the gate structure and under the first end portion and the second end portion of the body.

17. The computing device of claim 16, further comprising:
  a memory coupled to the board.

18. The computing device of claim 16, further comprising:
  a communication chip coupled to the board.

19. The computing device of claim 16, wherein the component is a packaged integrated circuit die.

20. The computing device of claim 16, wherein the component is selected from the group consisting of a processor, a communications chip, and a digital signal processor.

* * * * *